United States Patent
Biswas et al.

(10) Patent No.: US 9,098,661 B1
(45) Date of Patent: Aug. 4, 2015

(54) EXTENSIBLE PLATFORM FOR BACK-ANNOTATION OF TARGET-SPECIFIC CHARACTERIZATION ONTO A MODEL OF A HARDWARE SYSTEM

(75) Inventors: Partha Biswas, Framingham, MA (US); John Zhao, Newton, MA (US)

(73) Assignee: The MathWorks, Inc., Natick, MA (US)

(*) Notice: Subject to any disclaimer, the term of this patent is extended or adjusted under 35 U.S.C. 154(b) by 1288 days.

(21) Appl. No.: 12/558,332

(22) Filed: Sep. 11, 2009

Related U.S. Application Data

(60) Provisional application No. 61/121,461, filed on Dec. 10, 2008.

(51) Int. Cl.
  *G06F 17/50* (2006.01)
  *G06F 9/44* (2006.01)
  *G06F 3/048* (2013.01)

(52) U.S. Cl.
  CPC .......... *G06F 17/5045* (2013.01); *G06F 3/048* (2013.01); *G06F 8/34* (2013.01)

(58) Field of Classification Search
  CPC ........ G06F 17/5045; G06F 8/34; G06F 3/048
  USPC ......... 703/14, 15, 19; 716/101, 104, 102, 116
  See application file for complete search history.

(56) References Cited

U.S. PATENT DOCUMENTS

| | | | |
|---|---|---|---|
| 4,970,664 A * | 11/1990 | Kaiser et al. | 715/804 |
| 5,555,201 A * | 9/1996 | Dangelo et al. | 716/102 |
| 5,754,442 A * | 5/1998 | Minagawa et al. | 703/19 |
| 5,949,690 A * | 9/1999 | Lawman | 716/102 |
| 6,295,636 B1 * | 9/2001 | Dupenloup | 716/103 |
| 6,378,123 B1 * | 4/2002 | Dupenloup | 716/104 |
| 6,421,818 B1 * | 7/2002 | Dupenloup et al. | 716/105 |
| 6,684,374 B2 * | 1/2004 | Ito et al. | 716/108 |
| 7,263,678 B2 * | 8/2007 | Byrn et al. | 716/113 |
| 7,290,239 B1 * | 10/2007 | Singh et al. | 716/104 |
| 7,337,100 B1 * | 2/2008 | Hutton et al. | 703/13 |
| 7,383,522 B2 * | 6/2008 | Murgai et al. | 716/113 |
| 7,437,697 B2 * | 10/2008 | Venkateswaran et al. | 716/113 |
| 7,610,573 B1 * | 10/2009 | Chan et al. | 716/104 |
| 7,895,029 B2 * | 2/2011 | King et al. | 703/15 |
| 8,028,260 B1 * | 9/2011 | Ravi | 716/113 |
| 8,402,449 B1 | 3/2013 | Biswas et al. | |
| 8,478,577 B2 * | 7/2013 | Ciolfi | 703/21 |

OTHER PUBLICATIONS

Xilinx, "System Generator for DSP, User Guide," Xilinx Inc., Release 10.1.1 (2008).

\* cited by examiner

*Primary Examiner* — Kamini S Shah
*Assistant Examiner* — Juan Ochoa
(74) *Attorney, Agent, or Firm* — Harrity & Harrity, LLP

(57) ABSTRACT

A system for facilitating system design includes a back-annotation tool that annotates a model of a hardware system with information derived from results of synthesizing the model to the target hardware description. The derived information may include timing information, information about area usage, power consumption, etc. The derived information may be displayed in conjunction with the model in a modeling environment.

26 Claims, 21 Drawing Sheets

```
         1002
         ┌─
    (1)  Unit_Delay6_out1<3>      0.34000    Tcko
    (2)  Unit_Delay6_out1_2       0.34000    intermediate
1004a
    (3)  Unit_Delay6_out1<2>      1.55600    net
   ┌(4)  Madd_Add1_out1_cy<3>     2.13200    Topcyf
    (5)  Madd_Add1_out1_lut<2>    2.13200    intermediate
    (6)  Madd_Add1_out1_cy<2>     2.13200    intermediate
1004b┐(7) Madd_Add1_out1_cy<3>    2.13200    intermediate
1004c┐(8) Madd_Add1_out1_cy<3>    2.13200    net
    (9)  Madd_Add1_out1_cy<5>     2.22100    Tbyp
    (10) Madd_Add1_out1_cy<4>     2.22100    intermediate
    (11) Madd_Add1_out1_cy<5>     2.22100    intermediate
    (12) Madd_Add1_out1_cy<5>     2.22100    net
    (13) Madd_Add1_out1_cy<7>     2.31000    Tybp
    (14) Madd_Add1_out1_cy<6>     2.31000    intermediate
    (15) Madd_Add1_out1_cy<7>     2.31000    intermediate
    (16) Madd_Add1_out1_cy<7>     2.31000    net
    (17) Madd_Add1_out1_cy<9>     2.39900    Tybp
    (18) Madd_Add1_out1_cy<8>     2.39900    intermediate
    (19) Madd_Add1_out1_cy<9>     2.39900    intermediate
    (20) Madd_Add1_out1_cy<9>     2.39900    net
    (21) Madd_Add1_out1_cy<11>    2.48800    Tybp
    (22) Madd_Add1_out1_cy<10>    2.48800    intermediate
    (23) Madd_Add1_out1_cy<11>    2.48800    intermediate
    (24) Madd_Add1_out1_cy<11>    2.48800    net
    (25) Madd_Add1_out1_cy<13>    2.57700    Tybp
    (26) Madd_Add1_out1_cy<12>    2.57700    intermediate
   ┌(27) Madd_Add1_out1_cy<13>    2.57700    intermediate
1004x
    ....

┌(104) Madd_Add4_out1_cy<33>   14.82400   intermediate
1006x(105) Madd_Add4_out1_cy<33>   14.82400   net
    (106) Unit_Delay8_out1<34>    15.24700   Tcinck
    (107) Madd_Add4_out1_xor<34>  15.24700   intermediate
    (108) Unit_Delay8_out1_34     15.24700   intermediate
    (109) Total    15.24700      intermediate
```

(1)  sfir_fixed/symmetric_fir/Unit_Delay6_out1   1.55600   abstract
(2)  sfir_fixed/symmetric_fir/Add1_out1          4.59100   abstract
(3)  sfir_fixed/symmetric_fir/Product1_out1      9.00300   abstract
1024 (4)  sfir_fixed/symmetric_fir/Product_out1      11.27300   abstract
(5)  sfir_fixed/symmetric_fir/Add5_out1          12.92800  abstract
(6)  sfir_fixed/symmetric_fir/Unit_Delay8_out1   13.48900  abstract
(7)  sfir_fixed/symmetric_fir/Add4_out1          13.48900  abstract
(8)  sfir_fixed/symmetric_fir/Unit_Delay8_out1   13.57800  abstract
(9)  sfir_fixed/symmetric_fir/Add4_out1          13.57800  abstract
(10) sfir_fixed/symmetric_fir/Unit_Delay8_out1   13.66700  abstract
(11) sfir_fixed/symmetric_fir/Add4_out1          13.66700  abstract
(12) sfir_fixed/symmetric_fir/Unit_Delay8_out1   13.75600  abstract
(13) sfir_fixed/symmetric_fir/Add4_out1          13.75600  abstract
(14) sfir_fixed/symmetric_fir/Unit_Delay8_out1   13.84500  abstract
(15) sfir_fixed/symmetric_fir/Add4_out1          13.84500  abstract
(16) sfir_fixed/symmetric_fir/Unit_Delay8_out1   13.93400  abstract
(17) sfir_fixed/symmetric_fir/Add4_out1          13.93400  abstract
(18) sfir_fixed/symmetric_fir/Unit_Delay8_out1   14.02300  abstract
(19) sfir_fixed/symmetric_fir/Add4_out1          14.02300  abstract
(20) sfir_fixed/symmetric_fir/Unit_Delay8_out1   14.11200  abstract
(21) sfir_fixed/symmetric_fir/Add4_out1          14.11200  abstract
(22) sfir_fixed/symmetric_fir/Unit_Delay8_out1   14.20100  abstract
(23) sfir_fixed/symmetric_fir/Add4_out1          14.20100  abstract
(24) sfir_fixed/symmetric_fir/Unit_Delay8_out1   14.29000  abstract
(25) sfir_fixed/symmetric_fir/Add4_out1          14.29000  abstract
(26) sfir_fixed/symmetric_fir/Unit_Delay8_out1   14.37900  abstract
(27) sfir_fixed/symmetric_fir/Add4_out1          14.37900  abstract
(28) sfir_fixed/symmetric_fir/Unit_Delay8_out1   14.46800  abstract
(29) sfir_fixed/symmetric_fir/Add4_out1          14.46800  abstract
(30) sfir_fixed/symmetric_fir/Unit_Delay8_out1   14.55700  abstract
(31) sfir_fixed/symmetric_fir/Add4_out1          14.55700  abstract
(32) sfir_fixed/symmetric_fir/Unit_Delay8_out1   14.64600  abstract
(33) sfir_fixed/symmetric_fir/Add4_out1          14.64600  abstract
(34) sfir_fixed/symmetric_fir/Unit_Delay8_out1   14.73500  abstract
(35) sfir_fixed/symmetric_fir/Add4_out1          14.73500  abstract
(36) sfir_fixed/symmetric_fir/Unit_Delay8_out1   14.82400  abstract
(37) sfir_fixed/symmetric_fir/Add4_out1          14.82400  abstract
(38) sfir_fixed/symmetric_fir/Unit_Delay8_out1   15.24700  abstract
(39) sfir_fixed/symmetric_fir/Add4_out1          15.24700  abstract
(40) sfir_fixed/symmetric_fir/Unit_Delay8_out1   15.24700  abstract

*Fig. 10B*

EXTENSIBLE PLATFORM FOR BACK-ANNOTATION OF TARGET-SPECIFIC CHARACTERIZATION ONTO A MODEL OF A HARDWARE SYSTEM

RELATED APPLICATIONS

This application claims the benefit of provisional patent application No. 61/121,461, filed Dec. 10, 2008, the contents of which are incorporated herein by reference in their entirety.

BACKGROUND

Model-based design tools attempt to simply a process of conceptualizing, designing, simulating and finally implementing custom hardware systems. A model-based design tool may be a graphical and/or textual modeling environment. In a textual modeling environment, a model may be represented as textual code. In a graphical modeling environment, a model may be represented as a block diagram. A block diagram is a representation of a real-world system through a diagram containing nodes referred to as "blocks" interconnected by lines. Blocks are functional entities that perform actions and transformations on data processed by the system. The lines represent streams of data, called "signals," flowing between the various blocks.

Once a system designer has modeled a system using model-based design tools, it may be necessary to translate a model of the system into a description or a hardware implementation of the actual hardware system. A hardware implementation may be, for example, an electronic circuit. Modern day electronic circuits may be described using a hardware description language (HDL).

"HDL" refers to any language from a class of computer languages for formal description of hardware. HDL can describe a hardware a system, its design, and tests to verify its operation by means of simulation. HDL provides a standard text-based expression of the temporal behavior and/or spatial structure of a hardware system. The syntax and semantics of the HDL include explicit notations for expressing time and concurrency, which are primary attributes of hardware.

Using the hardware description from HDL code, a software program called an HDL synthesis tool can infer hardware logic operations from the hardware description statements and produce an equivalent list of generic hardware primitives to implement the specified behavior.

In such a way, a textual and/or graphical model of a real-world hardware system may be automatically transformed into an implemented version of the real-world system or some of its parts.

BRIEF DESCRIPTION OF THE DRAWINGS

FIGS. 10A-B illustrate exemplary critical path in target characterization description and corresponding abstracted critical path.

DETAILED DESCRIPTION

Figure 1:
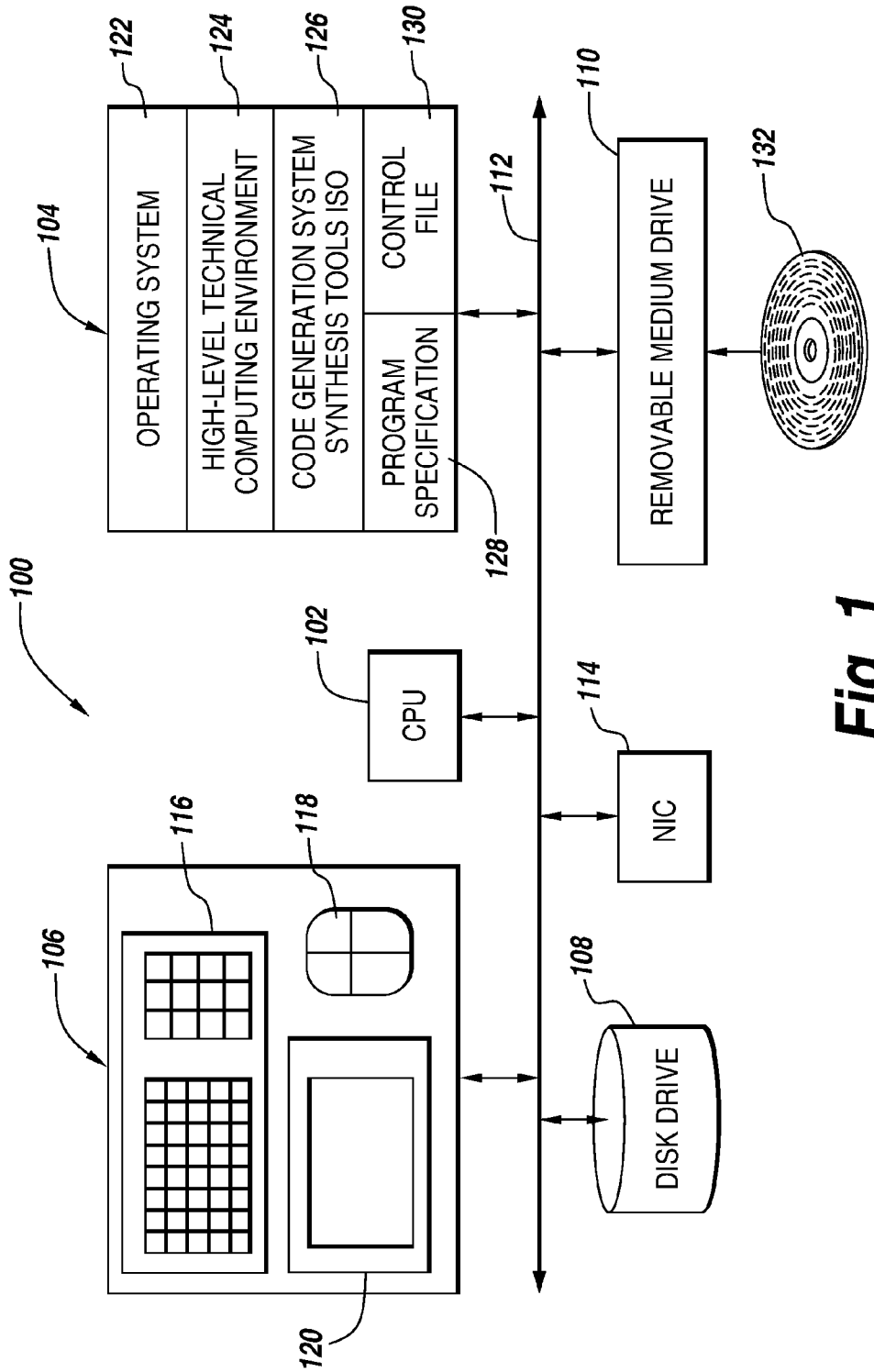
FIG. 1 is a schematic illustration of a computer system 100 for implementing and utilizing an embodiment.

Exemplary embodiments described herein facilitate model-based design and implementation of hardware systems by annotating models of hardware systems with information derived from generating code for and synthesizing the corresponding systems.

In a model-based design methodology, a design engineer creates or modifies a high level model of a hardware system using one or more modeling tools and/or environments. The high level representation may be a graphical block diagram model and/or a textual model realized in a high-level textual languages. The model is then passed to a code generation tool, which receives the high level representation of the system and generates hardware description level code for deploying the system in hardware. The code generation tool transforms the high level representation into a lower level HDL representation. The generated HDL code may then be processed by target-specific synthesis tools for hardware realization. The process of generating code and synthesizing it to target-specific representations is referred to as "lowering" the design.

In designing hardware systems, design engineers may steer their systems toward various design goals. Meeting system design goals may involve considering trade-offs between specific metrics like performance, area and energy utilized by the resulting hardware system. In the model-based design methodology, it may be desirable to make design changes only to the source model—that is, to the high-level representation of the system—and let the design tools handle the process of processing the modified design and remapping it to hardware. However, the low-level characterization data may be difficult to relate to the high-level source model. Therefore, to a designer working only with a high-level representation of the system, it may not be obvious how to change the source model in order to achieve the desired optimization goals or to balance the trade-offs. When the models are significantly large, tracing back information to the source model manually may be a daunting task.

In an embodiment, a modeling environment provides tools for automatically annotating a high level model with information from the target characterization data. Such annotation may be visually superimposed over the high level model in order to further aid the design process, or it may be presented to a design engineer in a form of a report. For example, information about one or more critical paths in the target-level system description may be displayed as highlighted paths on the original model. A critical path is a data-flow path in the target system that requires the longest minimum processing time. Furthermore, information about area, power usage and other details about the target-level system may also be displayed on or in conjunction with the high level model. Using such additional information, the system designer may make informed decisions as to which modifications may be necessary, if any, in order to make the hardware system meet the necessary design goals.

The process of annotating high level model with information from the target characterization data may be referred to as "back-annotation." The back-annotation may happen as a separate step in a system design workflow, or it may proceed in parallel with the high-level system modifications. In an embodiment, the back-annotation information may be displayed upon user's input requesting such information or upon user's input instructing the modeling environment or other tools to generate the target-specific characteristics. Alternatively, the back-annotation information may be kept up to date during various model modifications.

More than one synthesis tool may be applied to the same model, or one synthesis tool may be applied multiple times with differing settings, and the modeling environment of an embodiment may back-annotate the model with data resulting from the application of multiple synthesis tools and/or multiple runs of the same tool. Such annotations about different possible target-level implementations may be useful to steer the system designer toward a particular design, hardware or a synthesis tool.

The synthesis tools need not be a part of the same modeling environment where the back-annotation information is collected and/or presented to a user. In an embodiment, back-annotation information may be extracted from target-level characterization data provided by third party synthesis tools. In another embodiment, there may be provided an application programming interface (API) for extracting needed information from the target-level characterization data. In yet another embodiment, users may be able to supply their own plug-ins or APIs for processing the target-level characterization data and extracting information for back-annotating the high-level model.

Computer System for Implementing an Embodiment

FIG. 1 is a highly schematic illustration of a computer system 100 for implementing and utilizing an embodiment of the invention. The computer system 100 includes a central processing unit (CPU) 102, a main memory 104, user input/output (I/O) 106, a disk drive 108, and a removable medium drive 110 that are interconnected by a system bus 112. The computer system 100 may also include a network interface card (NIC) 114. The user I/O 106 includes a keyboard 116, a mouse 118 and a display 120.

The main memory 104 stores a plurality of libraries or modules, such as an operating system 122, and a high-level technical computing environment 124. The main memory 104 may also include a code generation system 126. The code generation system 126 may be configured as a toolbox or an add-on product to the high-level technical computing environment 124. The Real Time Workshop (RTW) of Simulink® computing environment is an example of the code generation system 126. The code generation system 126 may generate Hardware Description Language (HDL) code. Furthermore, stored in the main memory 104 there may be a program specification 128 and tools 150 to synthesize hardware layout from the HDL code generated by the code generation system 126 or from a model stored in the high-level technical computing environment 124.

The removable medium drive 110 is configured to accept and read a computer readable medium 132, such as a CD, DVD, floppy disk, flash memory or other medium. The removable medium drive 110 may further be configured to write to the computer readable medium 130.

Suitable computer systems include personal computers (PCs), workstations, servers, laptops, and palm computers. Nonetheless, those skilled in the art will understand that the computer system 100 of FIG. 1 is meant for illustrative purposes only and that the present invention may be used with other computer systems, processing systems or computational devices. The present invention may also be used in a network, e.g., client-server, computer architecture.

Suitable operating systems 122 include the Windows series of operating systems from Microsoft Corp. of Redmond, Wash., the Linux operating system, the MAC OS® series of operating systems from Apple Inc. of Cupertino, Calif., and the UNIX® series of operating system, among others.

As indicated above, a user or developer, such as an engineer, scientist, programmer, etc., may utilize the keyboard 116, the mouse 118 and the computer display 120 of the user I/O 106 to operate the high-level technical computing environment 124, and generate code.

Suitable high-level technical computing environments for use with the present invention include the MATLAB® and SIMULINK® technical computing environments from The MathWorks, Inc. of Natick, Mass. With the MATLAB® technical computing environment, a user may create models using a textual representation. With the Simulink® technical computing environment, a user creates a graphical model by dragging and dropping blocks from a library browser onto a graphical editor, and connecting them with lines that correspond to mathematical relationships and/or data flow between the blocks. There are other high-level development tools, including tools that are extensions of or work in conjunction with the MATLAB® and Simulink® technical computing environments. Such complementing tools may include Stateflow modeling environment, Simbiology modeling environment and others. Stateflow is an extension to the Simulink® technical computing environment that allows users to specify state machines and flow charts. A Stateflow chart may be created by dragging states, junctions and functions from a graphical palette into a drawing window. The user can then create transitions and flow by connecting states and junctions together.

Some additional possible examples of suitable graphical modeling environments that may be used to develop a graphical model in accordance with exemplary embodiments are, but are not limited to, Lab VIEW® or MATRIXx software from National Instruments, Inc., Mathematica® software from Wolfram Research, Inc., Mathcad software of Mathsoft Engineering & Education Inc., Maple™ software from Maplesoft, a division of Waterloo Maple Inc., Dymola software from Dynasim AB of Lund, Sweden, Extend software from Imagine That, Inc. of San Jose, Calif., Scilab™ and Scicos software from The French National Institution for Research in Computer Science and Control (INRIA), Le Chesnay Cedex, France, MSC.Adams® software from MSC.Software Corporation of Santa Ana, Calif., modeling software from dSPACE of Paderborn, Germany, electronic design automation (EDA) software from Cadence™ of San Jose, Calif. or Synopsis® software of Mountain View, Calif., the BEACON software family from Applied Dynamics International of Ann Arbor, Mich., etc. In addition, modeling environments, such as those that support modeling physics-based domains, Unified Modeling Language (UML), for example, Rhapsody® software from iLogix, Inc. of Toronto, Canada or Rational® software from International Business Machines Corporation of Armonk, N.Y., or SysML software like ARTiSAN Studio from ARTiSAN Software Tools, Inc of Beaverton, Oreg. or Rhapsody® software from iLogix, Inc., etc., may be suitable for implementing a graphical model in accordance with the exemplary embodiments. Other suitable graphical and/or textual computing environments may include the LabVIEW programming system from National Instruments Corp. of Austin, Tex., the Visual Engineering Environment (VEE) from Agilent Technologies, Inc. of Santa Clara, Calif., the Khoros development system now from AccuSoft Corp. of Northborough, Mass., a C programming system, a JAVA programming system, a C++ programming systems, and a Unified Modeling Language (UML) environment, among others.

A high-level technical computing environment may include capability to generate code from a model. Such capability may be provided in the technical computing environment itself or by add-on or stand-alone software products.

In addition, present on the computer system 100 there may be synthesis tools 150 that convert an HDL description of a system into a more low-level specification of a hardware system. The generated target-level characterization data may describe a hardware realization or may be further exported to layout tools for hardware realization. The hardware realization may include components such as Field Programmable Gate Arrays (FPGAs), Application Specific Integrated Circuits (ASICs), Complex Programmable Logic Devices (CPLDs), processors, memory components, networking components, etc. Synthesis tools for the FPGA target architectures may include, but are not limited to: Synpify from Synplicity, Inc., Leonardo-Spectrum/Precision RTL from Mentor, DC FPGA from Synopsys, XST from Xilinx, Quartus from Altera, etc.

A synthesis tool may generate target characterization data. Such target characterization data may be a netlist of hardware components and their interconnections, as well as additional data about a target implementation. Such additional data may include information about critical paths in the target implementation, timing, a number of hardware lookup tables (LUTs) used, etc.

In an embodiment, a user may be able to control code generation options, such as how HDL code is generated for selected sets of blocks within the model. In this way, the generated HDL code may be optimized for speed, chip area, latency, etc., based on various design considerations. There are usually trade offs between speed of the system (or delay encountered in the system), throughput of the system and/or the area of the system. These trade-offs form a design space that is available for exploration during system design and/or HDL code generation and hardware synthesis.

In lowering the HDL code, synthesis tools may go through multiple phases and perform target-specific optimizations, such as, for example, place-and-route optimizations. The resulting netlist may contain many more implementation details than the source models. When a model is sufficiently large, determining the target-level effects to changes in the high level model may be problematic. But even in small, apparently clear models, the target-level critical path may be unobvious, depending on the type of the target architecture. Therefore, back-annotation may be a useful tool assisting system engineers in designing and modifying their systems.

Back-Annotation Framework

Figure 2:
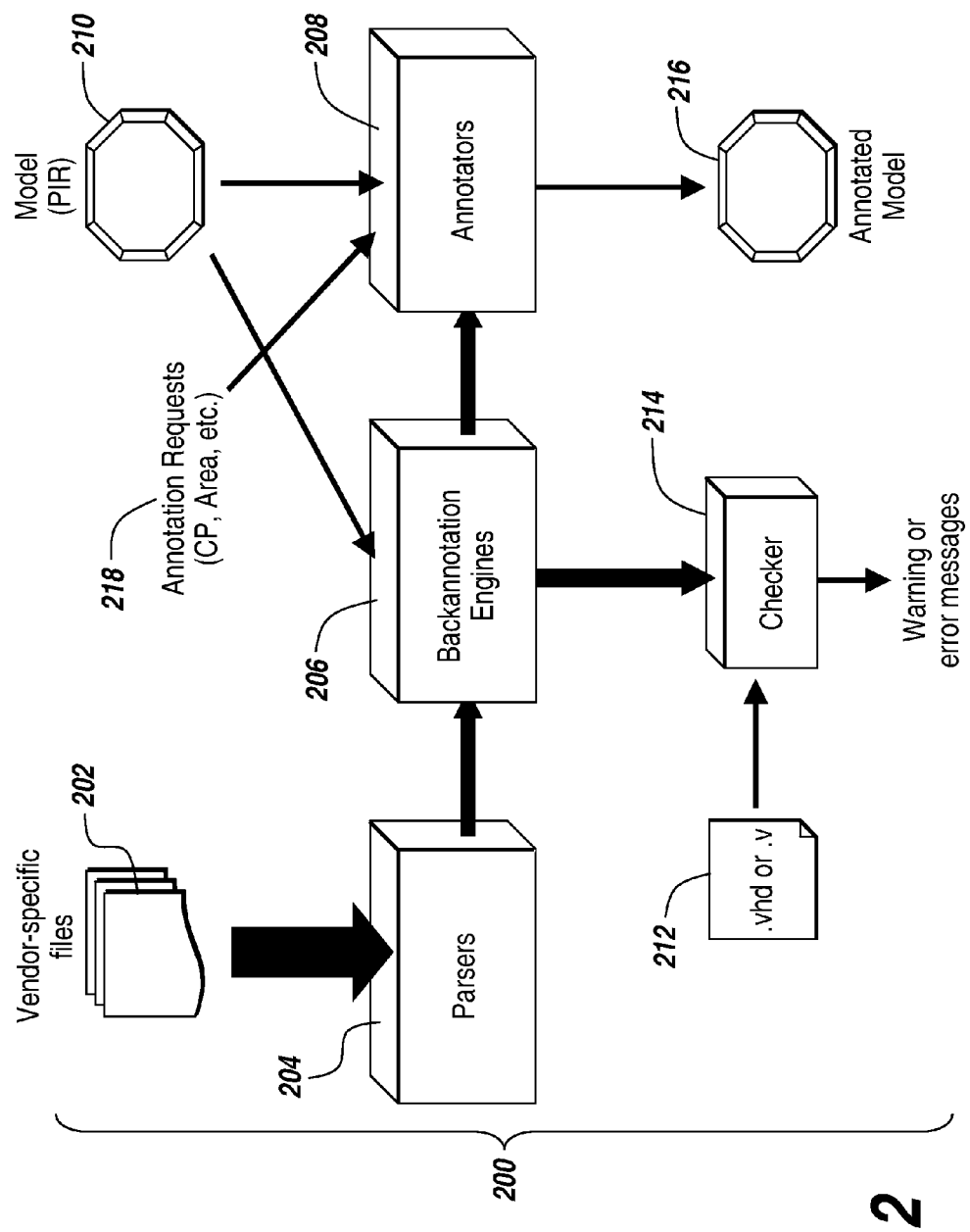
FIG. 2 is an illustration of a hardware and software framework for implementing an embodiment.

Illustrated in FIG. 2 is a hardware and software framework for implementing an embodiment capable of annotating models with target characterization data resulting from lowering of the model. The lowering may be actual or only contemplated—that is, in some cases, the target characterization data is obtained from the actual lowering of the model, and in other cases the target characterization data may be merely projected based on the model.

System 200 includes one or more parsers 204, one or more back-annotation engines 206 and one or more annotators 208. Annotators 208 receive model 210 or an intermediate representation of the model and annotate the model with requested data based on preferences or annotation requests 218.

The information for annotating model 210 may come from back-annotation engines 206, which may gather all the relevant information from the intermediate representations and process the model and relevant information in order to provide the requested annotation data. Different back-annotation engines may cater to different parameters or operate according to different algorithms. Such annotation engines may be built into system 200 or may be capable of being plugged-in independently. An embodiment may include a single back-annotation engine 206 capable of generating different annotation data based on annotation requests 218 and various optimization parameters. In an alternative embodiment, multiple back-annotation engines may operate in parallel or separately in order to provide the desired data.

Back-annotation engines may rely on data received from one or more parsers 204. Parsers 204 may process vendor-specific files 202 and output information in a predetermined format. Different parsers may be used for different target vendors that create different intermediate representation. Alternatively, a single parser may be adapted to process vendor- or target-specific information for multiple targets and/or vendors.

In an embodiment, there may be an application program interface (API) and/or a predetermined format that parsers 204 may use to supply information to back-annotation engines 206 and that back-annotation engines 206 may use to request information from parsers 204. A user may plug in different parsers or create additional parsers, if desired, so long as those parsers implement the same API as parsers 204 of system 200. Parsers 204 and parser API are discussed in further detail in FIG. 4 and the corresponding description.

Back-annotation engines 206 may interact with one or more checkers 214. Checker 214 may inspect the information generated by back-annotation engine 206 and report found warnings or errors, if any. Such warnings and/or errors may be based on predetermined annotation quality metrics and/or user preferences. For example, a user may indicate a preference to receive a warning if the annotations are likely to be too numerous or if the annotations may be incomplete. For example, if a user is requesting model 210 to be annotated with information about all critical paths in the target system, the user may elect to receive a warning if the number of such critical paths exceeds a predetermined number. In order to provide reports of warnings and/or errors or other style metrics, checker 214 may take as input target characterization data and/or HDL data 212.

Once annotators 208 receive all necessary information, such information may be displayed to a user in a separate report and/or visually overlaid on a model, resulting in annotated model 216. The user may be able to inspect annotated model 216 and perform various additional tasks, such as add or remove annotations, request different annotations, modify annotations by hand, change annotation preferences, etc.

Processing Workflow

Figure 3A:
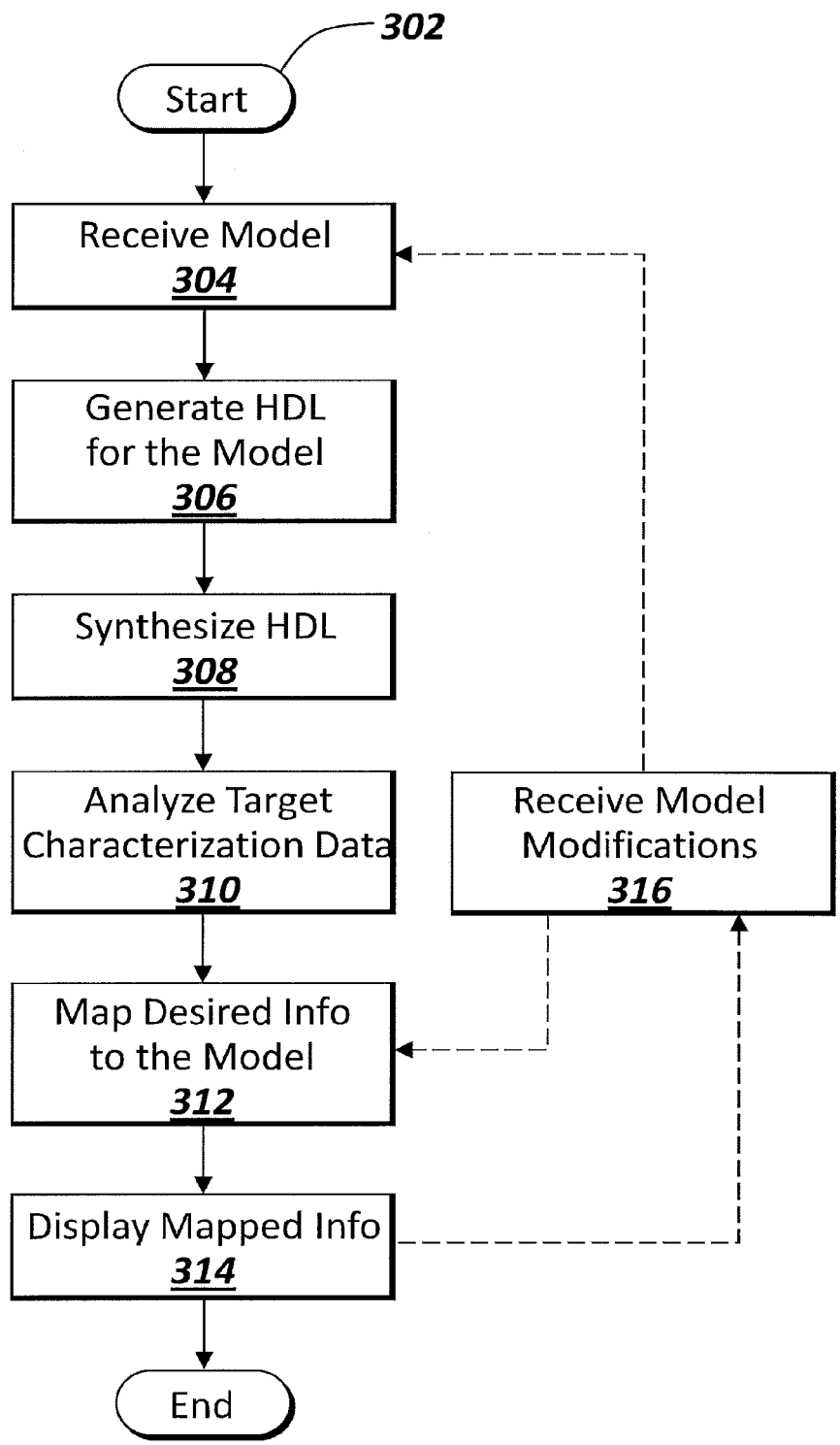
FIGS. 3A-B are flowcharts illustrating software and hardware processing of an embodiment and corresponding data generated by the acts of the processing.

FIG. 3A is a flowchart illustrating high-level processing of an embodiment providing back-annotation information to a user. After back-annotation processing is started (302), it receives a model that is to be annotated (304). The model may be a graphical and/or textual model. The model may be received in the same representation as it is stored in a modeling environment and/or it may be represented using an intermediate representation. Such a representation may be, for example, an .mdl file of the Simulink® modeling environment, a compiled model, a data-flow and/or block list representation of the model, etc.

The model may be processed in order to generate hardware description level representation of the system that the model represents (306). In an embodiment, generation of the HDL representation may be accomplished using tools provided with the modeling environment. In an alternative embodiment, third party tools may be used to generate HDL representation of the model. In yet another embodiment, generation of the HDL by tools separate from synthesis tools may be omitted and a synthesis tool may generate HDL in addition to synthesizing the system. In yet another embodiment, the synthesis tool may be able to generate target characterization data directly from a high-level representation of the model.

The model is then synthesized (308). Synthesis of the model results in the low-level hardware data directed at the particular target hardware. The target characterization data may include a low-level description of the hardware necessary to implement the system of the initial model. Such system description may be a netlist and may include a listing of hardware components and interconnections between them. The target characterization data may also include additional information about the target—such as, for example, a list of one or more critical paths of the target, the number of LUTs or other hardware units in the target, etc. Additional target characterization data may include information about power consumption of the target system, cost, etc.

The target characterization data may then be analyzed to extract information necessary for annotating the model (310). Such analysis may involve parsing the target characterization data using one or more parsers 204 and/or using additional processing to determine the necessary information from the information contained in the target characterization data. For example, in an embodiment, the target characterization data may not contain a summary of power usage or space of the target hardware system, and these parameters may need to be computed by counting and/or analyzing individual elements in the netlist.

The desired target characterization data may then be mapped to the model (312). In some cases, this mapping may require sophisticated analysis, because the hardware components in a netlist do not typically have a one-to-one correspondence to model elements from which that netlist has been derived. More than one hardware components may correspond to a single model element. Likewise, some model elements may have been optimized away during the lowering stages, and may not be present as such in the resulting hardware. Furthermore, even if there is a one-to-one correspondence between a model element and a hardware component, such correspondence may not be immediately obvious based on inspection of the target characterization data because, for example, components may be labeled differently than the model elements and/or components may be connected in a manner differing from the model connections. Mapping target characterization data to the model is discussed in further detail in connection with FIG. 6.

Once desired target characterization data has been obtained and mapped to the model, it may be displayed to the user (314). The display may be in the form of a textual and/or graphical report. The displaying of the model annotation data may be overlayed on the model itself. For example, critical paths and/or critical areas may be highlighted on the model. Furthermore, if a model is synthesized on two or more different targets or on the same target using different parameters, the resulting critical paths and other characterization data may differ from synthesis to synthesis, despite the fact that the model remains unchanged.

The critical path information may be displayed in different colors, based on the user preferences. For example, in an embodiment, each critical path may be displayed in a different color or critical paths from different target system implementations may be displayed in different colors. Alternatively, visual implements other than color may be used to indicate the critical paths of the model.

The model may be annotated with timing information derived from target characterization data. For example, different paths and/or elements may be annotated with estimated minimum execution time. In such a way, a user may get an indication of what elements and/or paths to modify in order to achieve more optimal clock times of the overall system.

Upon viewing back-annotation information, the user may want to modify the model, and that model may once again be passed to annotators (316). The modified model may then be lowered again and the resulting information analyzed to derive annotations for the model (304 through 314). Alternatively, annotations for the model may be derived directly, without going through all the lowering steps. Such annotations may be estimates of what the model modifications are likely to result in hardware implementations. For example, if a user removes a model element, the annotations may represent estimates of the model timing and critical path information without that element. The estimates may be derived using various algorithms and/or estimators. In yet another embodiment, the system may be lowered and necessary annotation data may be derived during the user's modification of the model, with or without explicit commands from the user. In such a way, up-to-date annotations for the model may be available as soon as the user requests them, or may even be displayed on the model without any additional user requests.

Figure 3B:
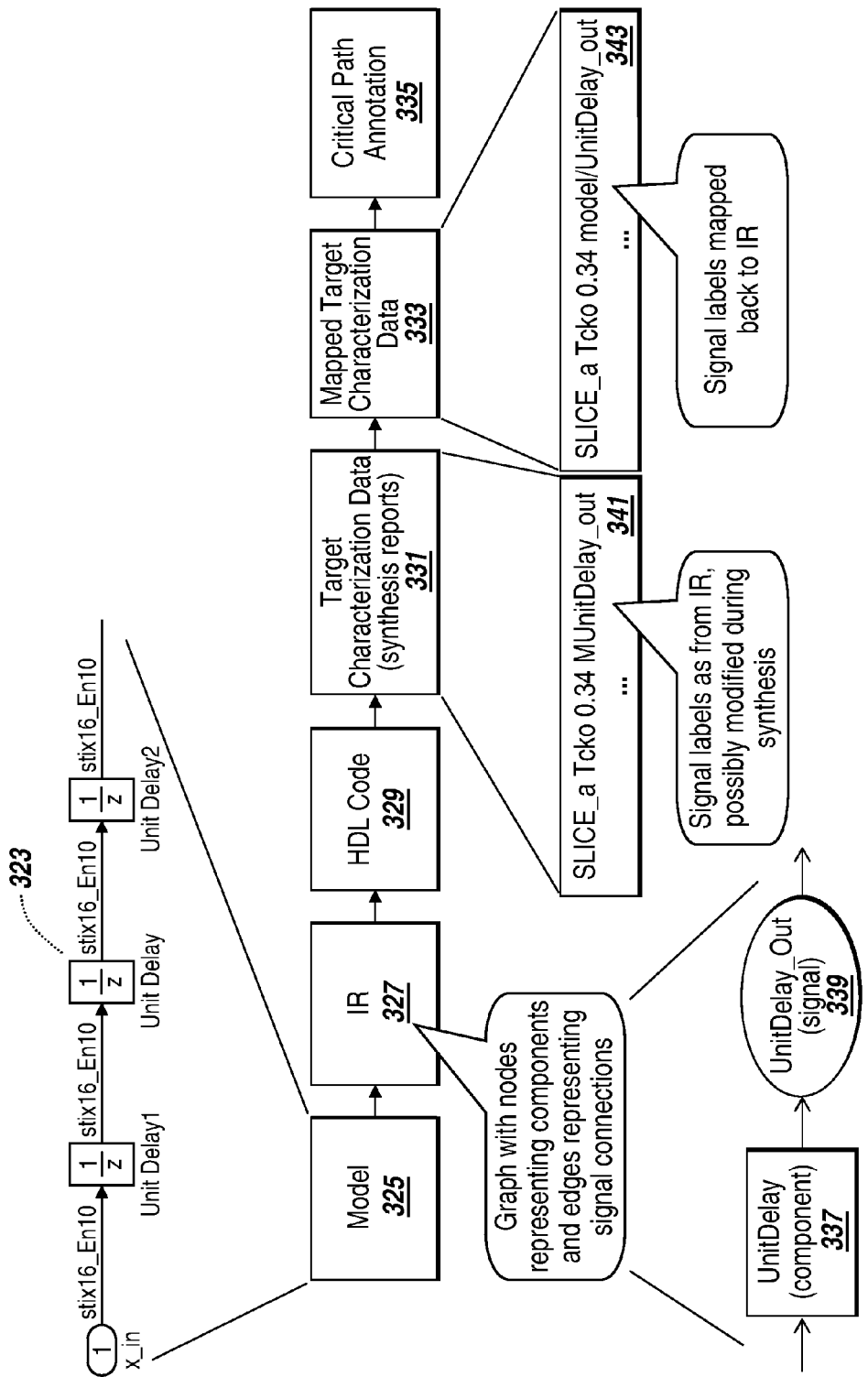

FIG. 3B illustrates data and corresponding data and transformations generated by different acts shown in FIG. 3A. Initially, a model 325 is received (see FIG. 3A, 304). Shown in FIG. 3B is model 323, which is an example of model 325. Model 323 includes three delay units. Model 325 is then processed into an intermediate representation (IR) 327. An IR may be, for example, a graph with nodes representing components and edges representing signal connections. Exemplary IR corresponding to model 323 may include UnitDelay component element 337 and UnitDelay_out signal element 339.

The IR 327 is then used to generate HDL code 329 (see FIG. 3A, 306). The generated code is received by a synthesis tool and is transformed into target characterization data 331 (see FIG. 3A, 308). Shown in FIG. 3B is an excerpt from exemplary target characterization data, showing line 341 corresponding to a unit delay of model 323. Model element names, such as signal names, may be modified during the code generation and/or synthesis stage, so they may differ from model element names of the IR 327. The target characterization data 331 is then mapped to the model, resulting in mapped target characterization data 333. Line 343 illustrates mapping of the information about a delay unit of model 323. The mapped target characterization data 333 is then displayed as a critical path annotation 335. The display may be overlayed over the displaying of model 323. In such a way, data is transformed and mapped by the back-annotation tool 200.

Figure 4:
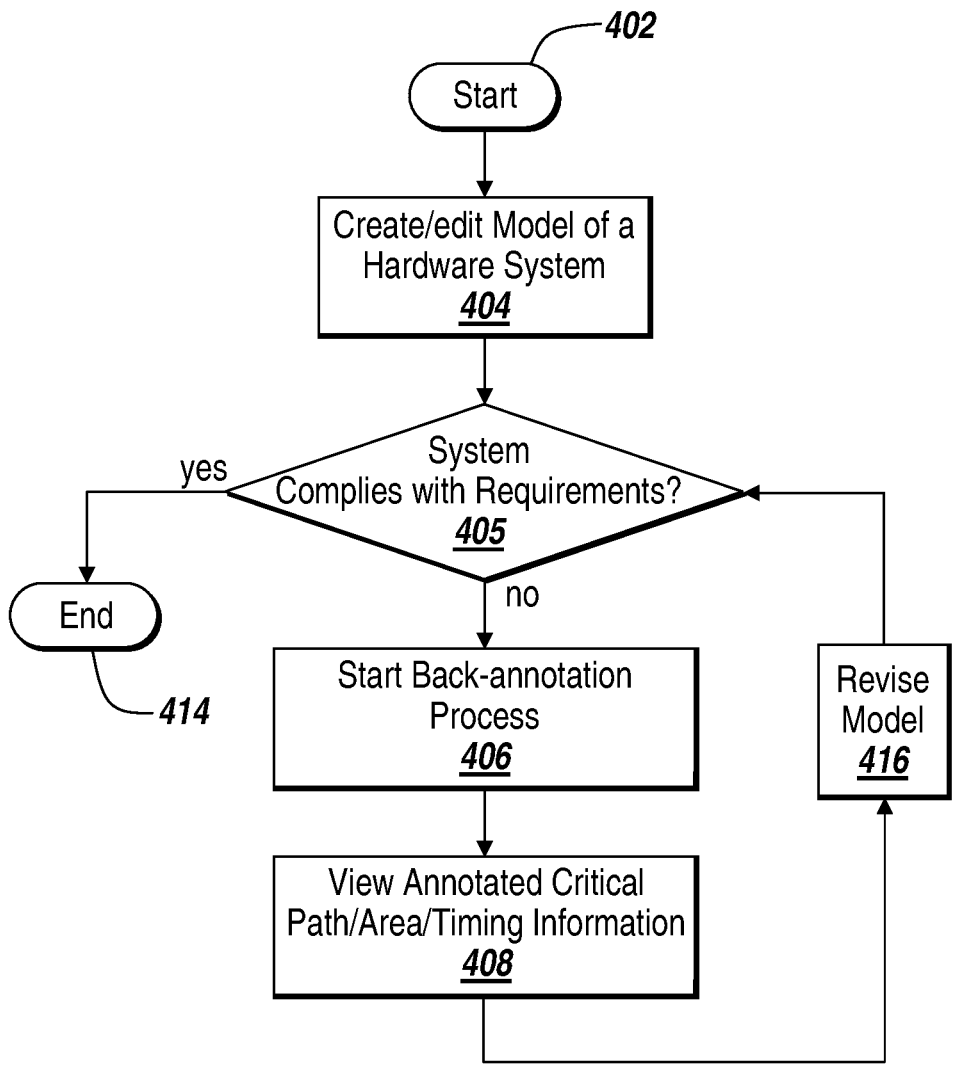
FIG. 4 is a flowchart illustrating a workflow of an embodiment.

A workflow of using target characterization data annotations on the model from the user's perspective is illustrated in FIG. 4. After entering the modeling environment (402), the user may create and/or edit a model of a hardware system (404). The user may check whether the system in the model complies with the appropriate system requirements (405). This checking may be performed manually or with the aid of one or more model analysis tools. Checking whether the system complies with the appropriate requirements may also involve generating code and/or synthesizing the system and analyzing the generated code and/or the target characterization data.

If the system does not comply with the desired system requirements, or if the user wants to improve some parameters of the system, the user may start the back-annotation process (406). The user may then request that the model be annotated with information derived from target characterization data for the model (406). Such information is then derived using software and hardware computing as described above in connection with FIG. 3.

Once the target characterization information is derived, it may be displayed on the model and the user may view it (408) in order to analyze the model. The user may pay attention to critical paths in the model and/or area information, timing information, etc. The user may then revise the model (416) based on the annotated target characterization information. If the revised model complies with the desired system requirements (405), the user may finish the editing (414) and may proceed to other steps of system design, as necessary, such as implementing and testing. If, however, the system doesn't comply with one or more predetermined design goals, or if the user believes that the system may be further improved or wants to try different modifications, the user may continue to use the back-annotation process (406) in order to revise the model.

In an embodiment, the back-annotations may be provided continuously as the user edits the model or at various points in the editing stage. The continuous annotations may be estimates of the actual target characterization information. For example, as the user is revising the model, one or more potential critical paths may be displayed. Such critical paths may be estimates rather than the indication of the actual critical paths. The estimates may be derived from the information from previous lowering of the model and/or from additional heuristics in the back-annotation system.

A system architect may use this workflow to realize a hardware system with pre-decided design constraints based on, for example, performance and area. These specific constraints may be derived from an environment in which the system is going to run. The back-annotations may be used in conjunction with other system design assistance or automation tools. For example, the system architect may chose to use distributed pipelining to automatically insert one or more pipeline registers. The system architect may then view the resulting target system information displayed in conjunction with the original model, without having to analyze the target characterization data by hand. Automatic pipelining is described in U.S. patent application Ser. No. 11/972,117 Filed Jan. 10, 2008, which is incorporated by reference herein in its entirety.

The instructions to annotate the model may be received from the user through a graphical and/or textual user interface. A textual user interface may include one or more commands, the parameters of which specify user preferences for back-annotation. A textual command may be, for example, "hdlannotatepath" command, which may be used in conjunction with the following parameters:

hdlannotatepath('numCP', '<timingfile>', <comma-separated parameter-value pairs>)

This command annotates a model after reloading the timing file referenced by <timingfile>;

gdkabbitatepath('numCP', <comma-separated parameter-value pairs>)

This command annotates a model using the already loaded timing file;

hdlannotatepath('reset')

This command resets all displayed paths;

hdlannotatepath('numCP', 'externalparser', <parserObject>, <comma-separated parameter-value pairs>)

This command annotates a model based on external parser referenced by <parserObject>. The parsers and parser objects are discussed in more detail in connection with FIG. 8 below.

The commands listed above are shown for illustration purposes only. As will be understood by one of skill in the art, the user interface for back-annotation is not limited to the commands shown herein or their parameters and may be implemented in numerous different ways, from textual commands, to graphical menus, etc.

Figure 5A:
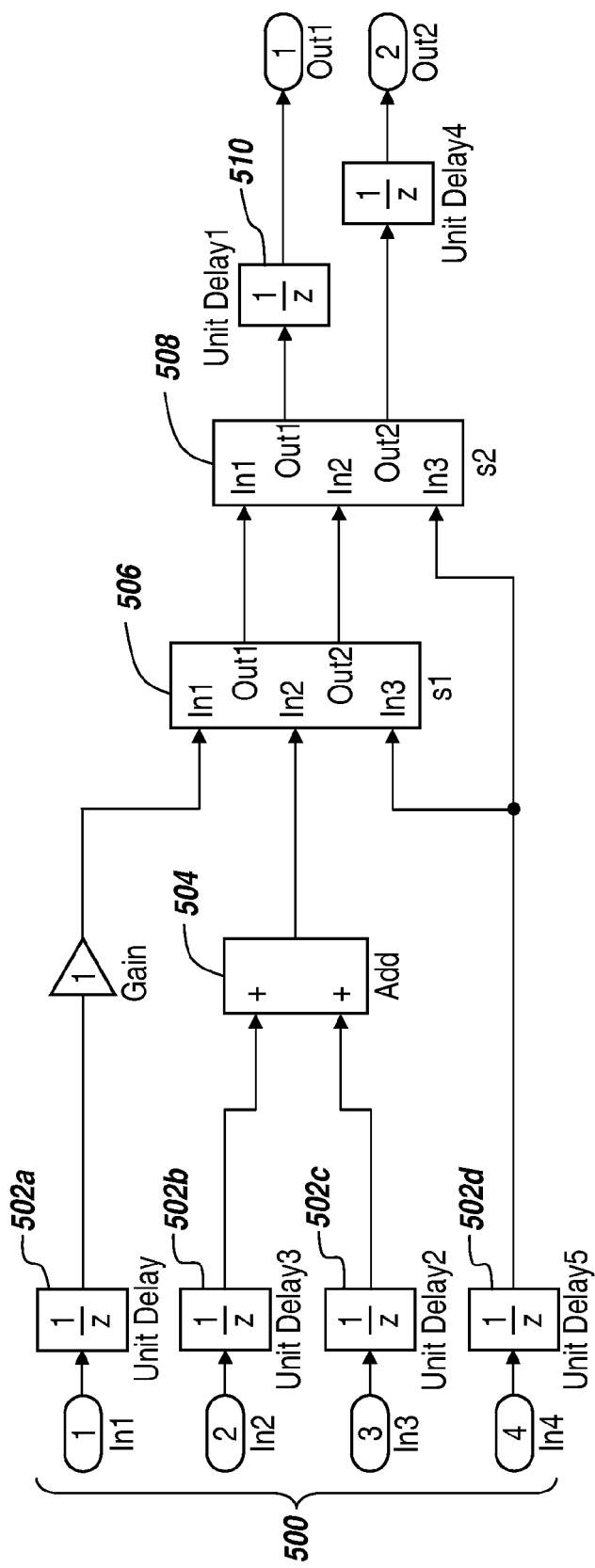
FIGS. 5A-F are examples of model annotations for an exemplary model according to an embodiment.
Figure 5B:
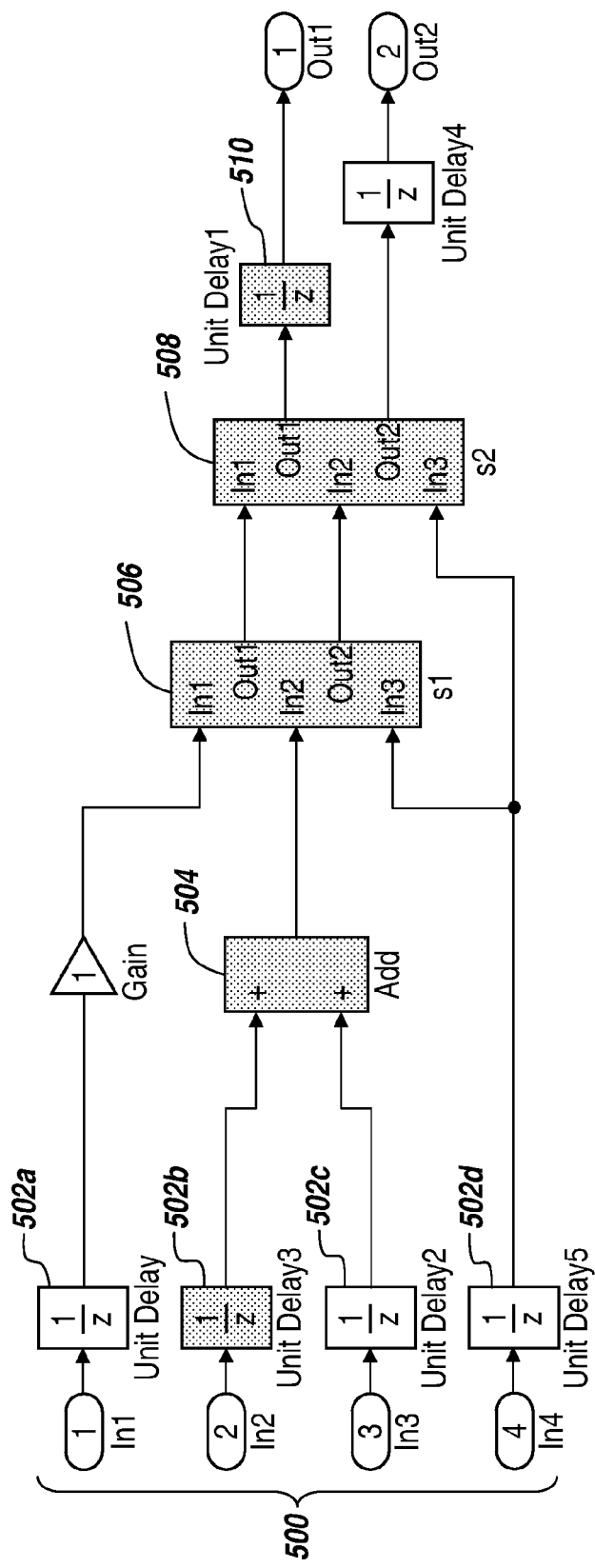

Illustrated in FIGS. 5A-F are examples of model annotations for an exemplary model. The user may start with model 500 as shown in FIG. 5A. Model 500 has, among other elements, unit delays 502a-d, adder 504, selectors 506 and 508 and another unit delay 510. The user may use a command hdlannotatepath('2', 'Subsystem_preroute.twr', 'showall', 'off')

to load the specified timing file ('Subsystem_preroute.twr')_ and then highlight the second critical path. The resulting highlighting is illustrated in FIG. 5B. As shown, unit delay 502b, adder 504, selectors 506 and 508 and unit delay 510 are highlighted as comprising the second critical path in the target system for model 200. In addition, shown on the model is timing information for each of the highlighted elements.

Figure 5C:
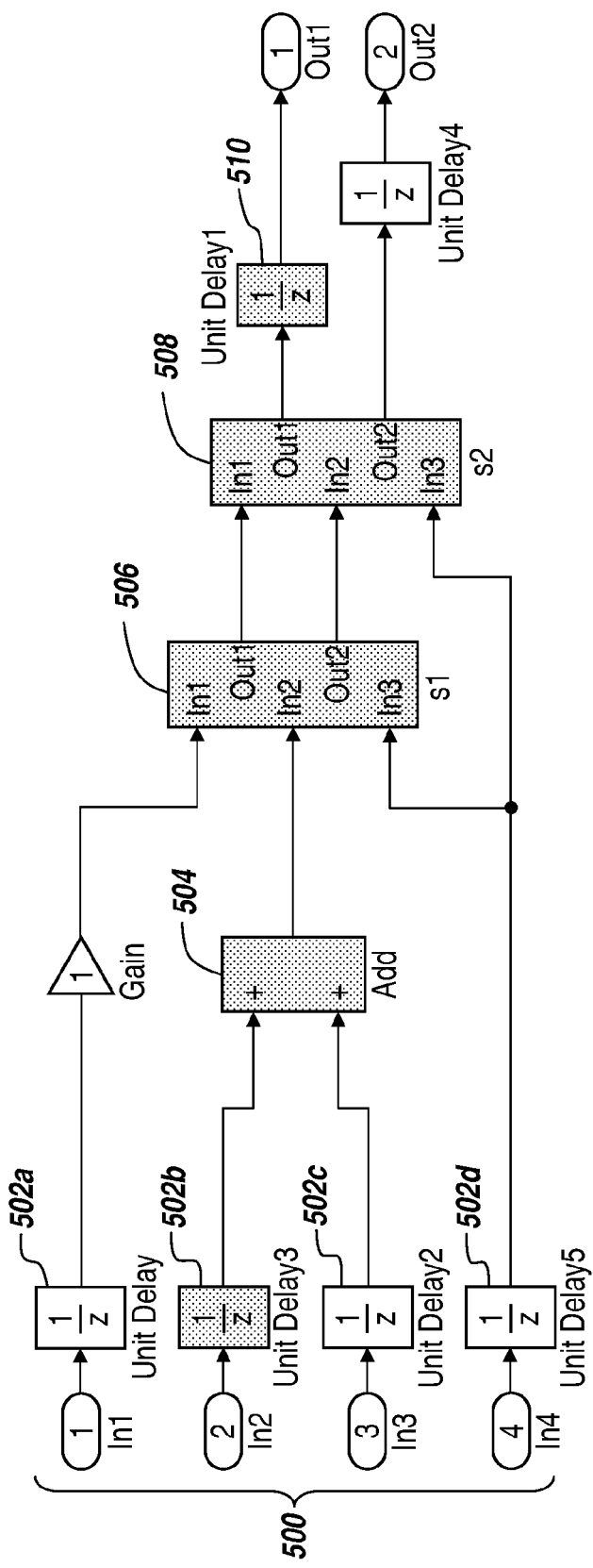

The user may then use a command hdlannotatepath('1', 'showall', 'off')

to use the loaded timing file and highlight the first critical path in the target system. The resulting annotations are illustrated in FIG. 5C. The two critical paths may be shown using different colors, as shown and timing information from both may be displayed. It should be noted that the first and the second critical path may coincide, as shown in FIG. 5C, or they may include some or all different elements. Two or more critical paths may coincide on the model while being counted as distinct critical paths of the target system because more than one hardware component may correspond to a single model element, thus creating distinct paths in the target hardware system, which may map to the same element and/or path on the model.

Figure 5D:
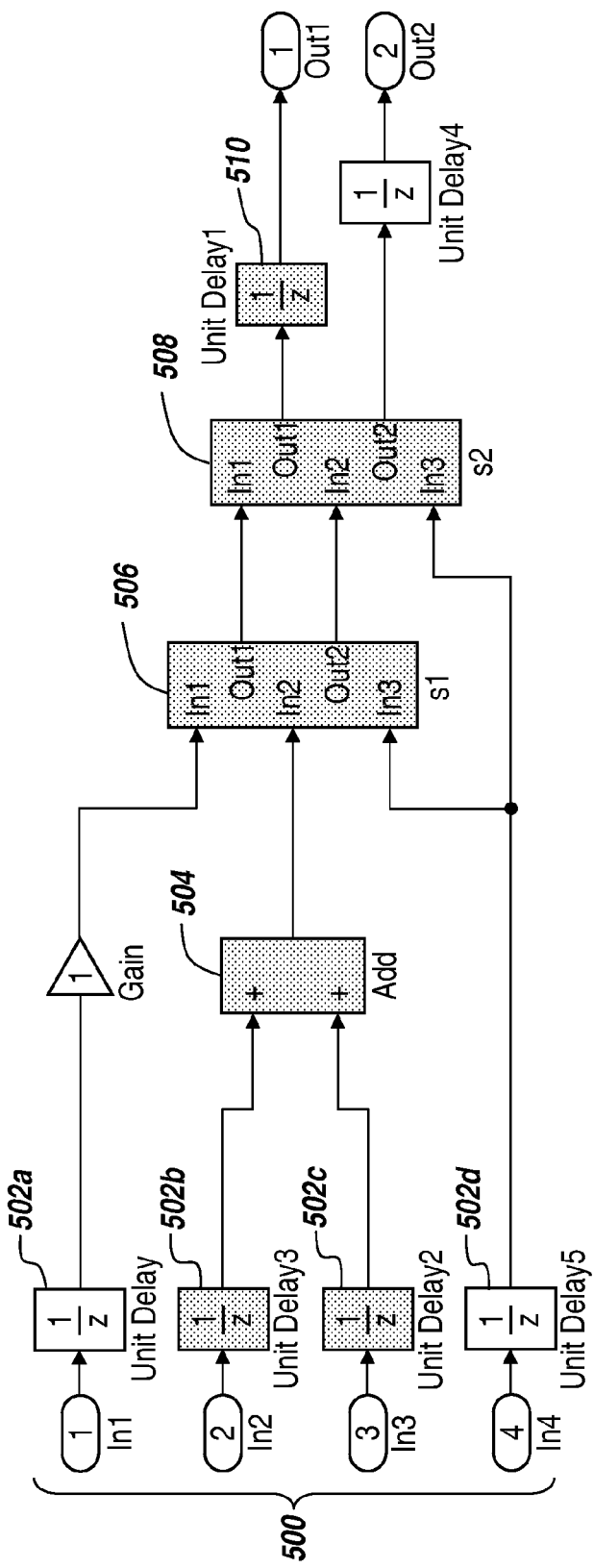

After viewing the first two critical paths, the user may remove all annotations using the hdlannotatepath('reset')

command, which resets all the critical paths highlighted since the last loading of the timing file, which in this case would mean all the critical paths displayed so far. The user may then use the command hdlannotatepath('3', 'showall', 'on', 'unique', 'on')

to use the loaded timing file and to highlight the first three unique critical paths. The resulting annotation is illustrated in FIG. 5D. As shown, highlighted on model 500 after this command are unit delays 502b-c, adder 504, selectors 506, 508 and unit delay 510 and the corresponding path delays.

Figure 5E:
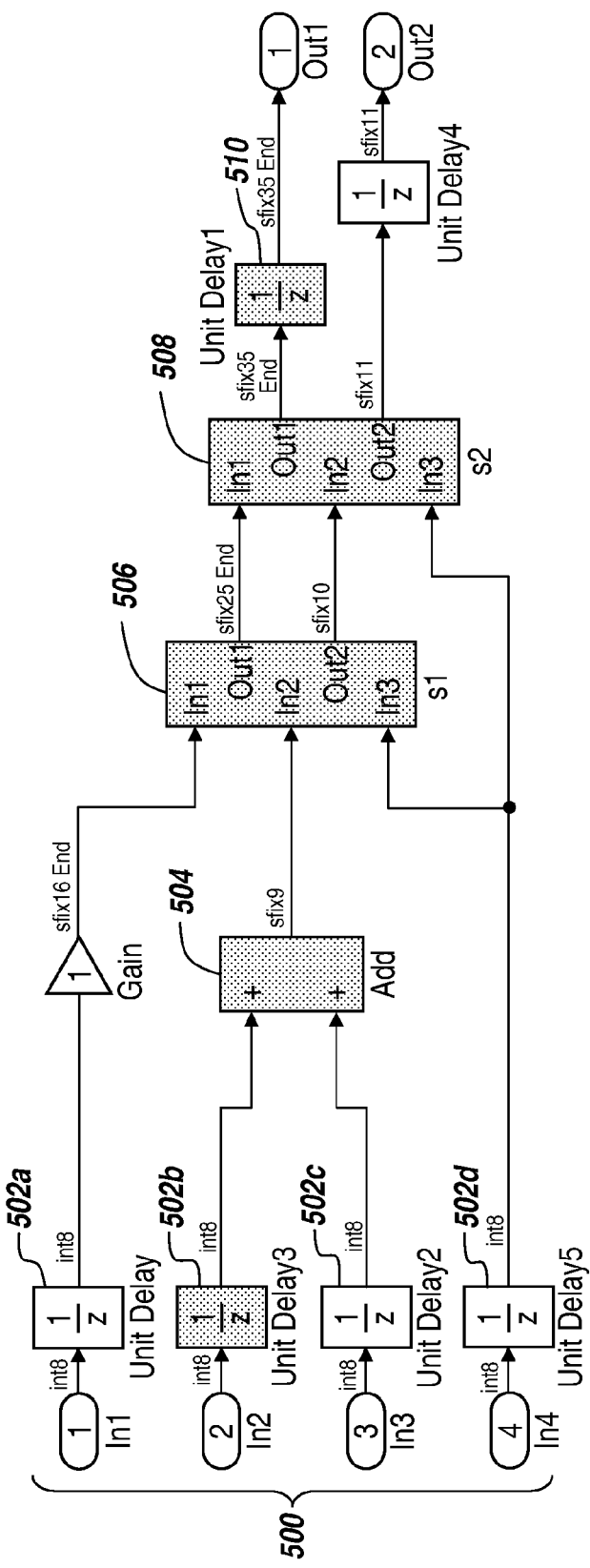
Figure 5F:
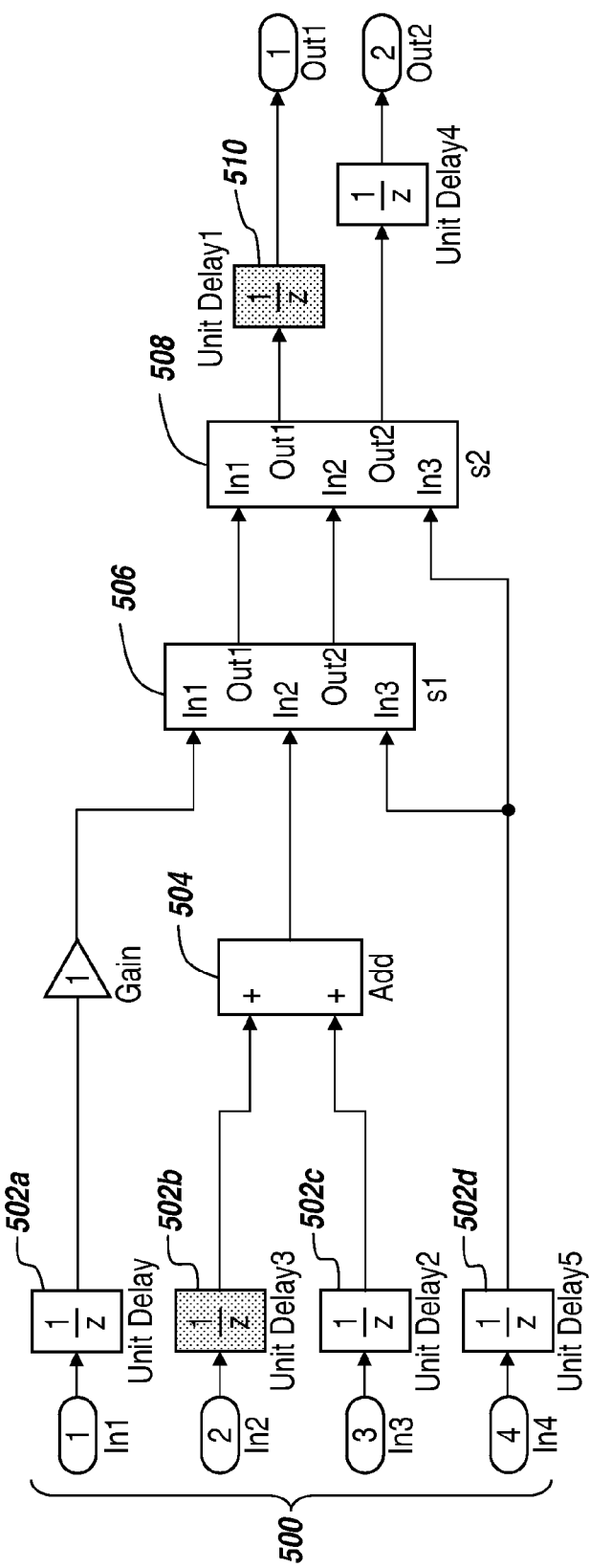

The user may then once again reset the highlighting and use the command hdlannotatepath('2', 'showall', 'off', 'showdelays', 'off')

to use the loaded timing file and to highlight the third critical path without showing the path delays. The resulting annotation is illustrated in FIG. 5E. The third critical path of model 500 includes model elements 502b, 504, 506, 508, and 510.

The user may be interested only in the starting and ending elements of one or more critical paths and/or in the entire critical region. In order to display only end points of the first critical path, the user may use the command hdlannotatepath('1', 'showall', 'off', 'endsonly', 'on')

The resulting annotation is illustrated in FIG. 5E. As shown, only unit delays 502b and 510 are displayed, which comprise the end points of the first critical path. In such a way, the user may explore the model and its corresponding target system without having to inspect the HDL and/or target characterization data by hand. The user may then make changes to the high-level model and see their repercussions overlaid over the model itself, which may be particularly useful in model-based system design. Many more aspects of the target system may be displayed in conjunction with the model than illustrated above may be implemented by one of skill in the art. A class diagram for an annotation system according to an embodiment is discussed in further detail in connection with FIG. 9 below.

Deriving Critical Path Information

The synthesis tools may supply information about critical paths in the target system. Such information may be extracted from the target characterization description using one or more parsers 204. The critical path information from the target characterization description may be presented using element descriptions for the target system. As discussed above, a single model element may map to one or more target hardware components. Alternatively, one or more model elements may be not represented by any separate hardware components, depending on the optimizations that may take place during the lowering stages. Therefore, there may not be a one-to-one mapping between the components in the target characterization description critical path and the model elements. Furthermore, even if there is a direct mapping, it may not be immediately obvious, because components may have different names and/or even functionality in the model and the corresponding target system. For example, a multiplier from a model may be represented by multiple adders in the target hardware system. If one or more of those adders form a part of a critical path, they may need to be mapped back to the multiplier model element.

Figure 6A:
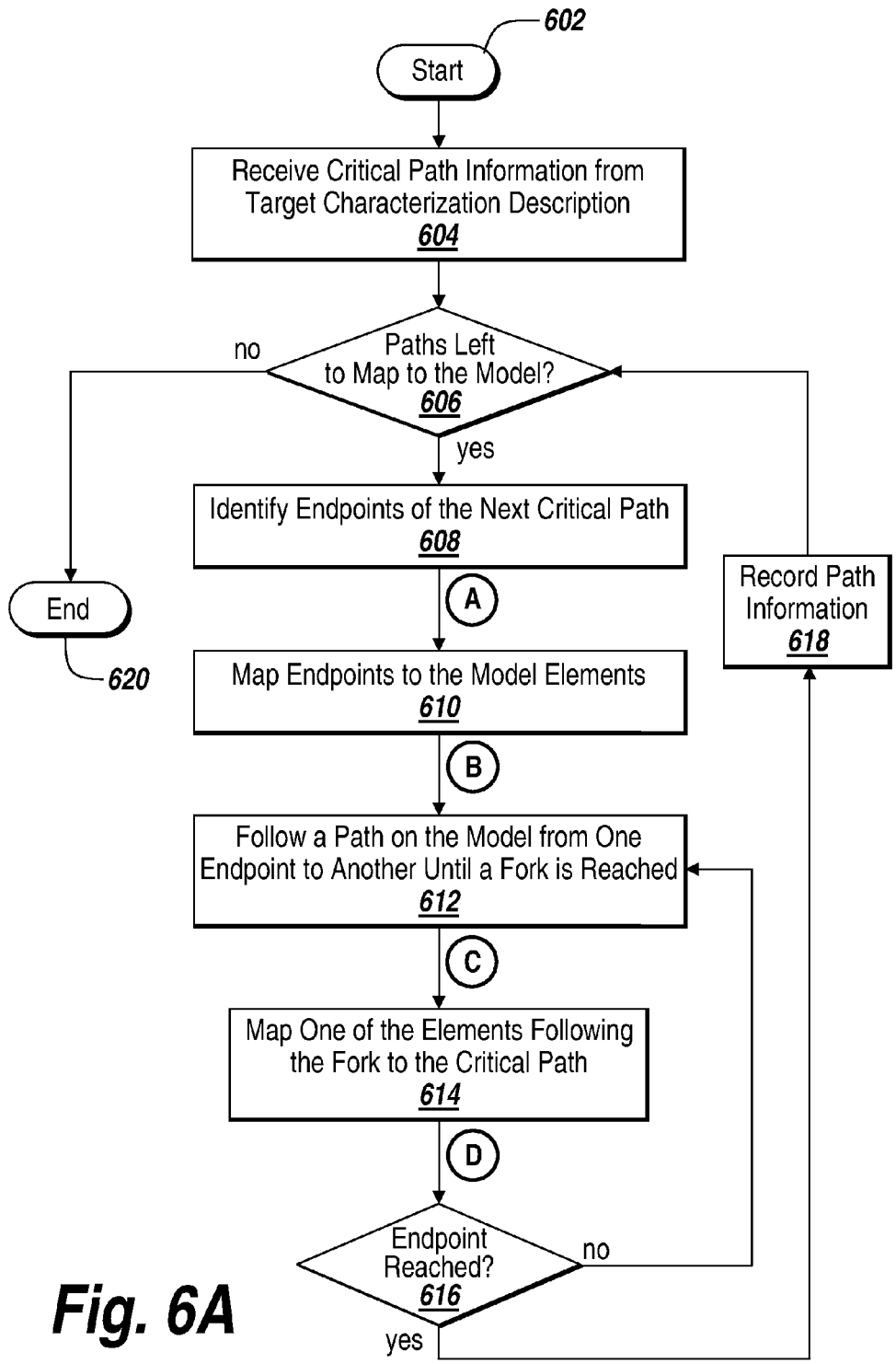
FIGS. 6A-C are flowcharts representing processing for mapping critical path information from target characterization description back to model elements.

Illustrated in FIG. 6A is a flowchart representing processing for mapping critical path information from target characterization description back to model elements. The mapping process, once started (602), receives critical path information from target characterization description (604). As described above, such information may be received from one or more parsers using the predetermined API, or it may be derived directly from information supplied by one or more synthesis tools.

Depending on the user preferences, one or more critical paths may be mapped to the model. In an embodiment, all critical paths may be mapped to the model, regardless of whether the user selects only a subset of them to be displayed. In an alternative embodiment, only those paths that the user requests displayed may be mapped back to the model. For every path that needs to be mapped to the model, as determined based on the preferences (606), endpoints of the path are identified (608).

The mapping of a critical path to the model then proceeds by mapping the endpoints of the path to the corresponding model elements (610). This mapping may be performed based on, for example, hardware component references and corresponding model element references. The references may include names and/or labels that are assigned to the hardware components by the synthesis tools. For example, names of the hardware components may include all or a portion of the model element name or reference from which it comes. In this case, the mapping tool searches the model for corresponding components.

In an alternative embodiment, hardware components may be mapped to the model elements by using traceability information, if any. For example, synthesis results may include traceability information back to the HDL information, which, in turn, may include traceability information back to the model. This information may be used to map a target component to a model element. In yet another embodiment, the synthesis results may include traceability information directly back to the model elements, which may be used to identify model elements corresponding to the endpoints of the critical path. If the endpoints of the critical path cannot be mapped to the model elements, back-annotation tool 200 may output an error. Alternatively, back-annotation tool 200 may displayed all the information it was able to derive—such as one of the endpoints, if found, and request additional input from the user, such as alternative parsers to use, etc.

Once the endpoints of the critical path have been mapped to the model elements, the mapping process may try to connect the endpoint model elements by a valid model path. The path may be followed from one endpoint—for example, from the start of the critical path—to another endpoint—for example, to the end of the critical path, until a fork in the path is reached (612). If there is a fork in the path—that is, if there are multiple possible paths from one endpoint to the other, model elements following the fork may be analyzed and a mapping between one of them and the critical path in the target characterization description may be found (614).

In such a way, the mapping of the critical path may proceed by following possible paths on the model, until the second endpoint is reached (616). In an alternative embodiment, every element of the critical path may be mapped to one or more model elements separately, and the path may then be constructed on the model using that mapping information. In yet another embodiment, mapping may proceed simultaneously from both endpoints of the critical path.

If one or more model elements forming a critical path cannot be identified conclusively, the back-annotation tool 200 may display an error to the user. In addition, a critical region may be displayed, encompassing all elements that have been identified as potentially belonging to a critical path. In yet another embodiment, a critical region may be identified as the region including the endpoints of a critical path, additional model elements that have been identified as forming parts of the path, if any, and all model elements that lie on all possible paths from one endpoint to another.

When the critical path has been identified to the best of the back-annotation tool's abilities, its information is stored (618), and the processing proceeds to identify additional critical paths, if necessary (606). The processing ends when all needed critical paths have been mapped back to the model (620).

In some cases, it may be difficult to identify some elements of a critical path. In such situations, rather than aborting the back-annotation for that critical path, alternative strategies may be employed. Even incomplete information about a critical path may be useful to the system designer, and, as such, the back-annotation tool 200 may attempt to provide such information.

Figure 6B:
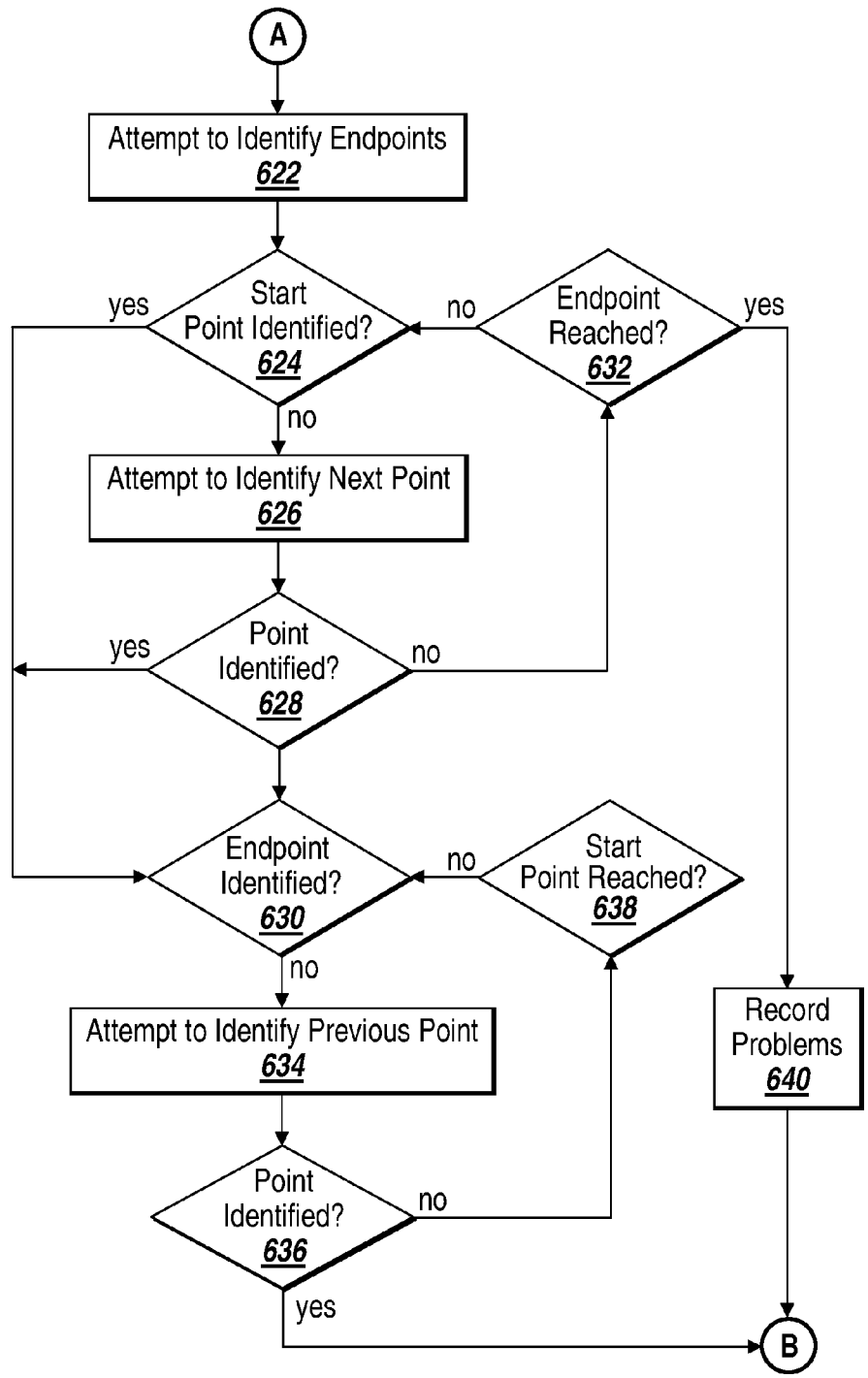

Illustrated in FIG. 6B is a flowchart for a process of identifying at least some information for the critical path for which one or both of the endpoints have not been mapped to the model. This processing may fit within the processing illustrated in FIG. 6A, instead of or in addition to mapping endpoints to the model elements (610), as shown. An attempt to identify the endpoints is made (622), as discussed previously. If the start point has not been conclusively mapped to a model element (624), the back-annotation tool 200 may attempt to map the next element in the critical path after the start point (626). If this element is mapped to the model (628), such information may be helpful to the user. If there are difficulties with mapping that element to the model as well and if the endpoint has not been reached (632), the identification may proceed to the following elements in the critical path (626-632). In an alternative embodiment, a user may be able to specify how far to search in the path before giving up.

Similarly, if the endpoint has not been identified (630), the back-annotation tool 200 may attempt to identify the point previous to the endpoint in the critical path (634 and 636). In such a way, the critical path may be traversed backwards, until the start point is reached (638) or until at least one element has been mapped to the model. Any ambiguities or problems in mapping one or both of the endpoints to the model may be recorded (640) and presented to the user.

Figure 6C:
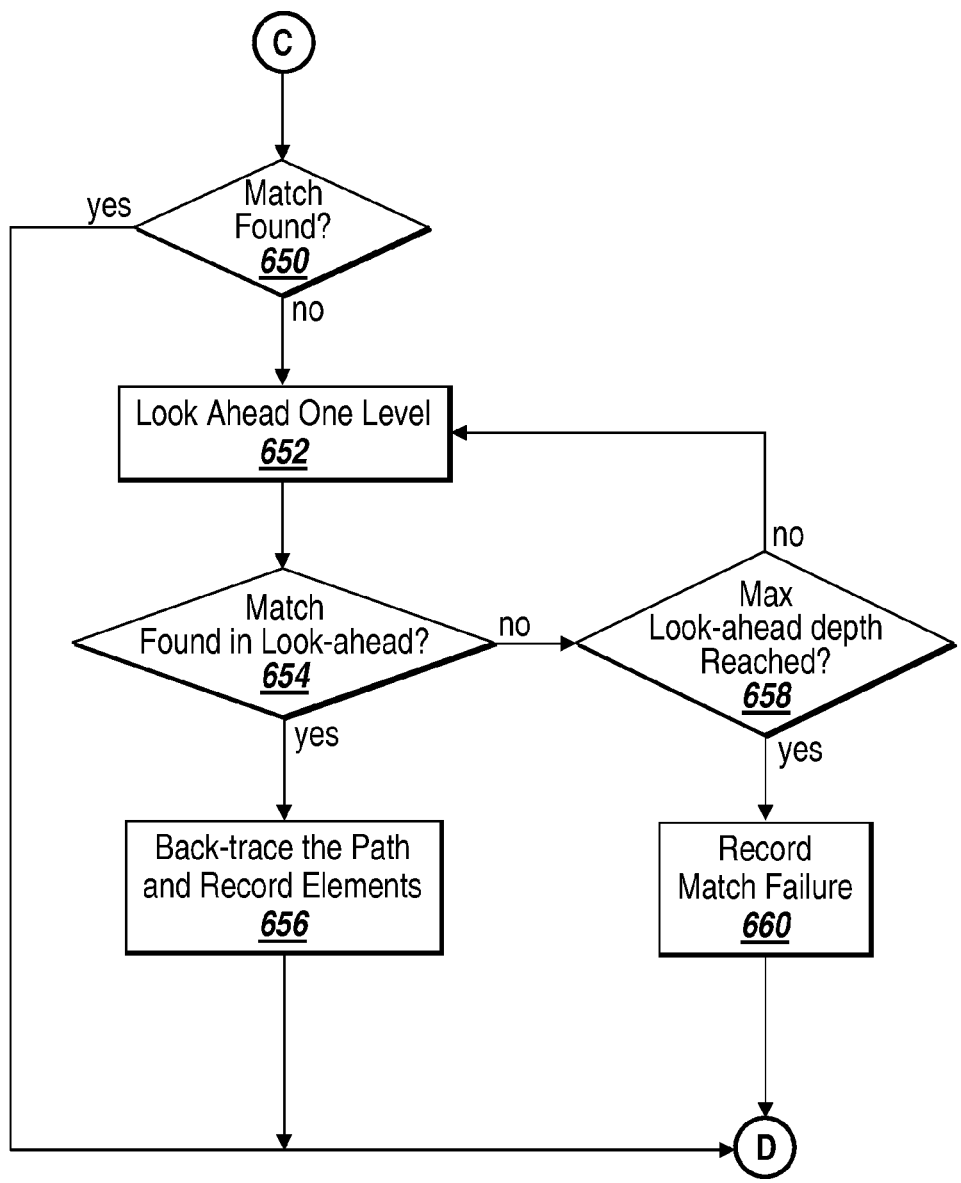

Illustrated in FIG. 6C is a flowchart for a process of identifying at least some information for the critical path if the path cannot be readily identified following a fork. As shown in FIG. 6A, following a fork, the back-annotation tool 200 attempts to match up one of the model elements after the fork with the critical path being investigated (614). If this match is found (FIG. 6C, 650), the identification can proceed. If, however, none of the model elements following a fork in the path can be conclusively identified as belonging to the critical path, the back-annotation tool 200 may proceed to look-ahead in the model (652). Looking ahead may involve examining elements in all possible paths following the fork and attempting to match up at least one of them with the critical path. The look-ahead may employ breadth-first search or any other tree and/or graph traversal techniques known to one of skill in the art.

A user may be able to set preferences identifying the depth of the look ahead—that is, how many forks to attempt to follow in order to identify the critical path. The identification process can follow the paths until the maximum look-ahead depth is reached (658) and/or until a match is found (654). If at least one model element following a fork (and potential additional forks) has been identified as matching an element of the critical path, a portion of the critical path may be identified by back-tracing from the identified model element to the previously identified elements of the path (656). In some cases, even looking-ahead may be inconclusive for identifying the critical path. In such situations, a failure to find exact match may be recorded (660) and alternative information, if available, such as, for example, the information about the critical region, may be presented to the user.

In an alternative embodiment, one or more model elements may be determined to belong to a potential critical path through inspection of the model elements themselves. This may be akin to a user inspecting the model elements and determining that a particular element is more likely to lie on the critical path than another element, because it seems more computationally expensive. Although traversal of the critical path has been described herein as following the data flow in the model, it need not be limited to that. Traversal may be accomplished in any direction. Furthermore, in an embodiment, multiple traversals may be used to map the critical path information to the model.

While some users may have an intuitive understanding of which elements are more computationally expensive than the others, in some cases even an experienced user may be unable to predict the exact critical path or all consequences of particular choices of model construction, due to the design choices that may be made by the lowering tools and that may be due to the specifics inherent in a particular target implementation.

Figure 7A:
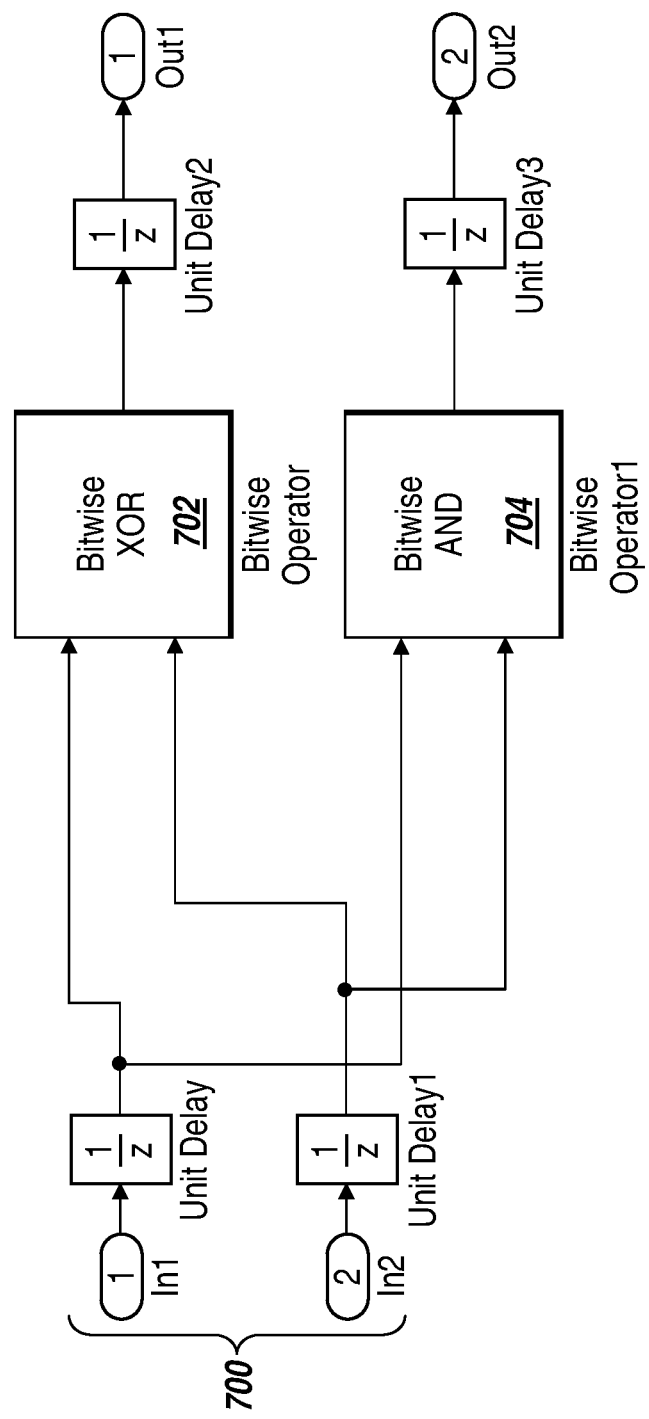
FIGS. 7A-C are examples of model annotations for a second exemplary model according to an embodiment.
Figure 7B:
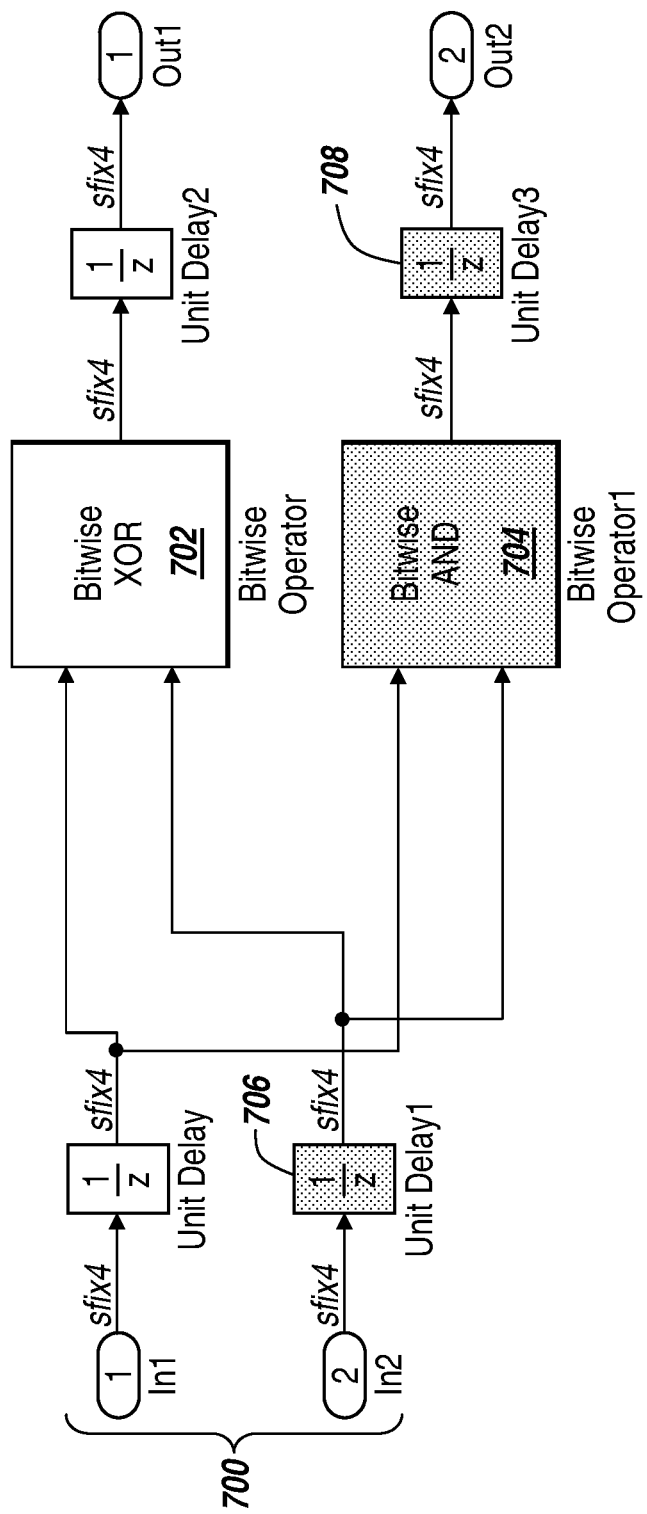
Figure 7C:
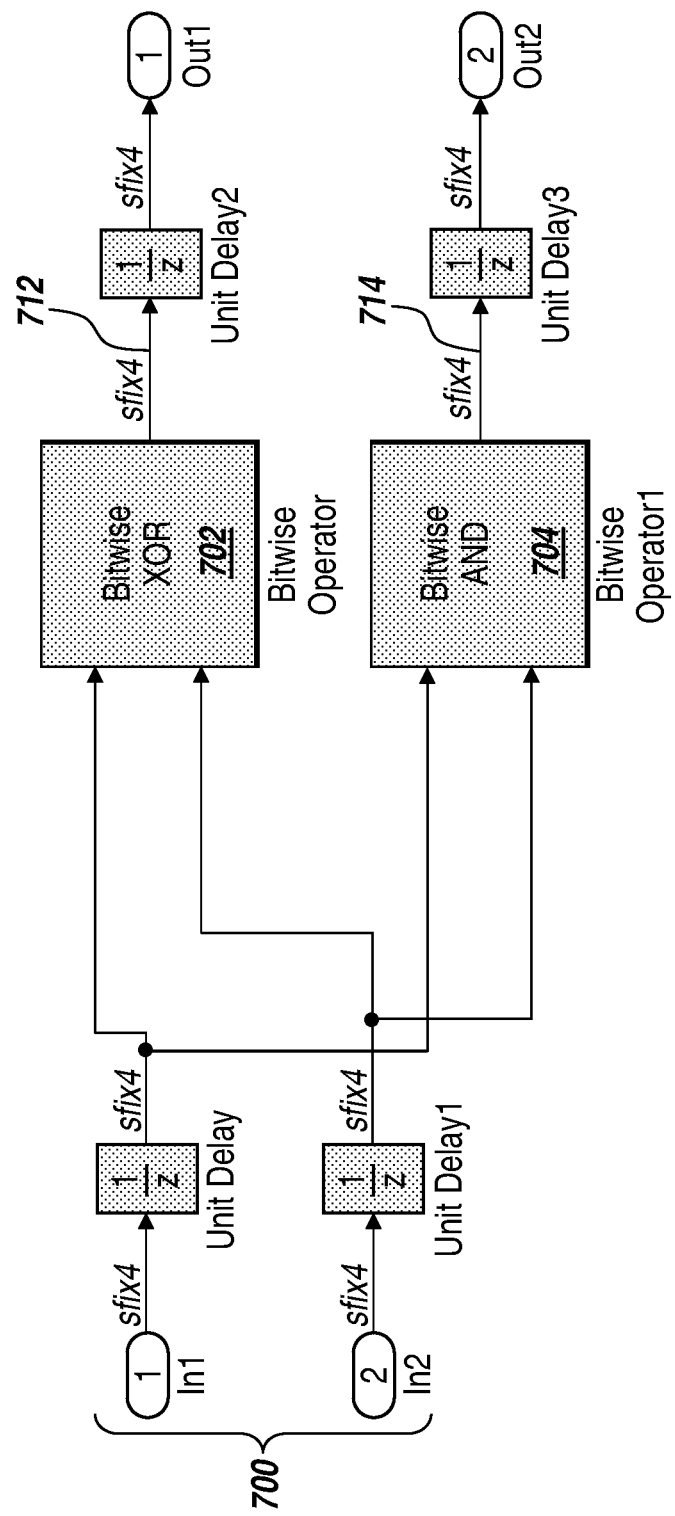

Illustrated in FIGS. 7A-C is a relatively simple system that may still offer unexpected resulting critical paths on the target system. Model 700 has two main computational elements: bitwise XOR 702 and bitwise AND 704. It may at first appear to the system designer that bitwise XOR 702 is more likely to form the first critical path than bitwise AND 704. However, depending on the target specifics, that may not be the case.

Shown in FIG. 7B is model 700 annotated with information about the first critical path in the target system. This critical path includes bitwise AND 704 and unit delays 706 and 708, but doesn't include bitwise XOR 702. Shown in FIG. 7C are the first three critical paths, and the second critical path does include bitwise XOR 702, while the third critical path once again includes bitwise AND 704. Their corresponding timing information can be seen in display elements 712 and 714. The system designer working on model 700 may then chose to replace one or more model elements with different elements and/or may attempt to use a different synthesis tool and/or different target, in order to see whether this design may be better implemented in a different target architecture or in the same target architecture, but using a synthesis tool. In such a way, a system designer may evaluate different synthesis tools or different target architectures without having to inspect the low-level target characterization data by hand.

Parsers

The target information generated in the synthesis process may be in a textual format and may be stored in a target file. The target file may be parsed to extract information about critical paths, area, power usage of the target system, etc. Such extraction may be performed using one or more parsers. A parser may be included in the back-annotation tool 200 or it may be supplied by a user or by a third-party. A parser may be any tool that accepts a target file as an input and provides one or more objects in a predetermined intermediate representation (IR) as an output. A parser may provide information about the critical paths, area, power usage, etc., extracted from the target file, or it may provide information about only a subset of those features of interest.

Figure 8A:
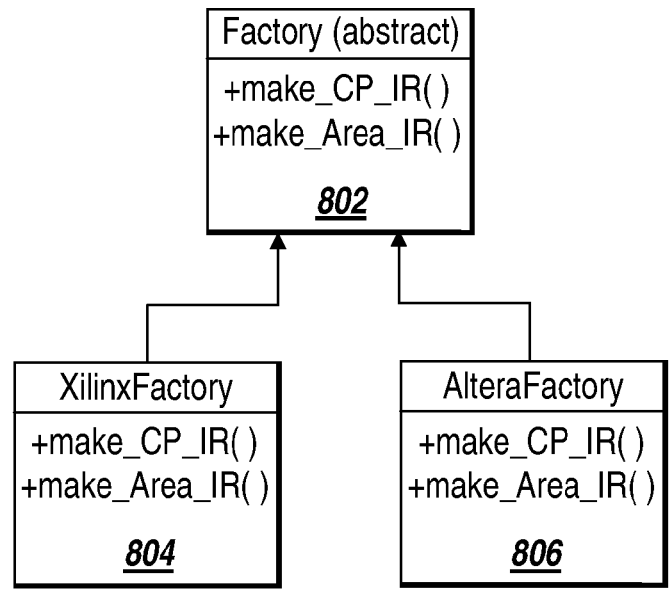
FIG. 8 is an illustrative class diagram for parser objects of an embodiment.

In some embodiments, a single parser may be able to parse different vendor files, while in other embodiments, different parsers may be employed to parse target files from different vendors. A parser may employ one or more vendor-specific factory objects (802, 804, and 806), as illustrated in FIG. 8A. A factory object may be a vendor-specific parser, which may then be abstracted into an abstract Factory interface.

Figure 8B:
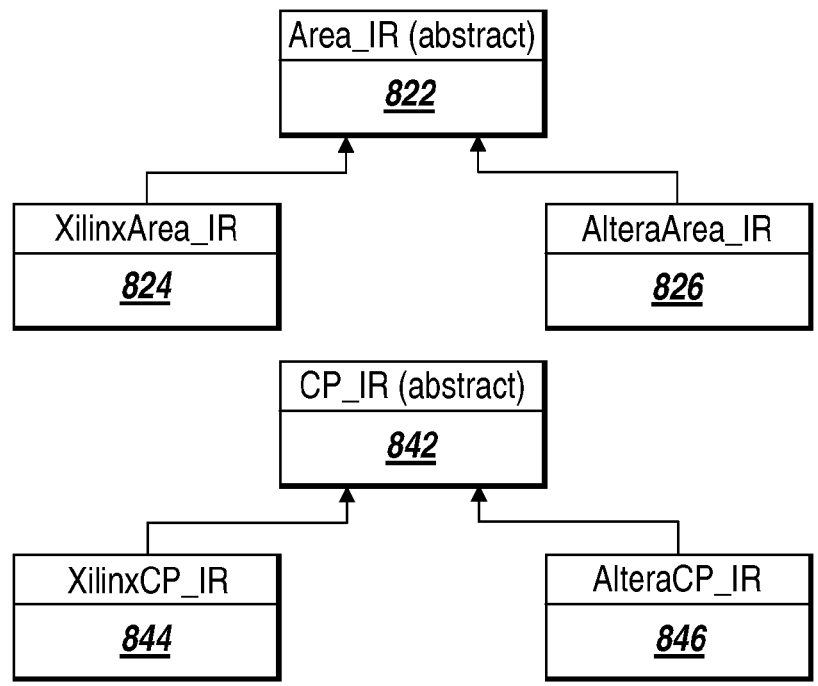

Similarly, there may be generic interfaces for functions for getting specific information from the target file, such as, for example, information about the area, critical path, etc. These generic interfaces (822 and 842) may be implemented using the vendor-specific functions (824, 826, 844 and 846), as illustrated in FIG. 8B. In such a way, a vendor may be able to supply its own IR objects for parsing its target files. The IR objects may have fixed interfaces, which may be defined by the generic parsers. For example, an IR object for the critical path may define the following interface:

getNumCPs→get the number of critical paths;
getNumNodes (c)→get the number of nodes in the $c^{th}$ critical path;
get CPNode (c, i)→get the $i^{th}$ node in the $c^{th}$ critical path;
getCPNodeCumulativeLatency (c, i)→get the cumulative latency of the $i^{th}$ node in the $c^{th}$ critical path;
getStartNode (c)→get the start node of the $c^{th}$ critical path;
getEndNode (c)→get the end node of the $c^{th}$ critical path.

In an embodiment a critical path may be represented as a vector of nodes with specific context-sensitive attributes. The parser interface is not limited to what is described herein and may be implemented in any number of ways as deemed appropriate by one of skill in the art.

Figure 9:
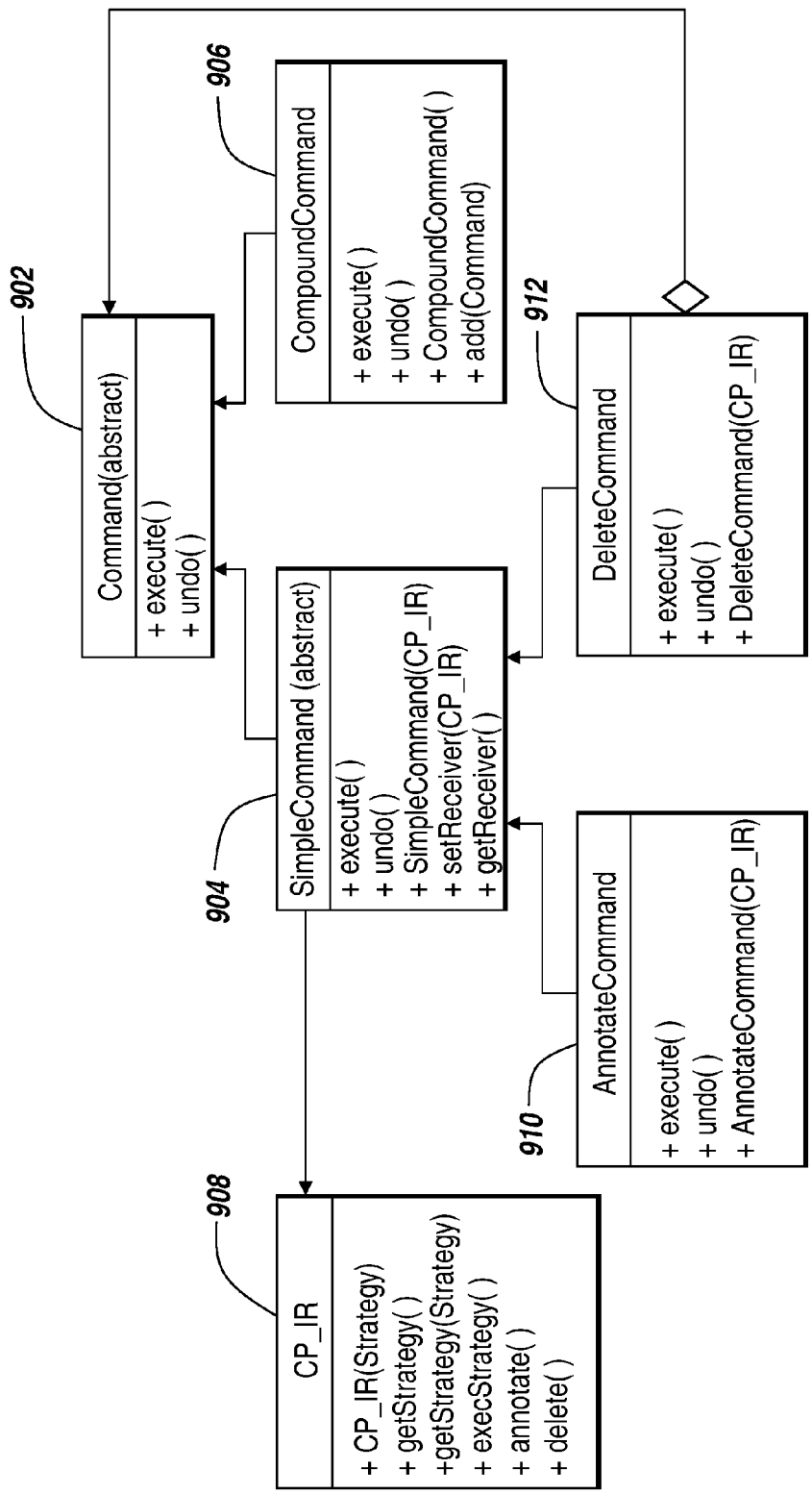
FIG. 9 is a class diagram for annotation system of an embodiment.

Information from the IR objects supplied by the parser may be processed using one or more different strategies. The strategies may describe how to abstract the information from the IR objects in order to back-annotate the model with that information. For example, there may be a strategy for the processing described in FIG. 6A and a strategy for the processing described in FIG. 6B and/or FIG. 6C. Alternatively, the processing of FIGS. 6A-C may be part of the same strategy. A class diagram of functionality using different strategies according to an embodiment is illustrated in FIG. 9. Objects/functions 902-912 may aid the extraction and processing of the target characterization data in order to back-annotate the model.

FIGS. 10A-B illustrate exemplary critical path in target characterization description provided by a parser and corresponding abstracted critical path derived by the back-annotation tool 200. Shown in FIG. 10A is a critical path as extracted from the target characterization data. This critical path is abstracted to an intermediate representation. An example of an intermediate representation is an intermediate representation used for code generation by the Simulink® modeling environment. Abstracting or mapping the critical path is performed by attempting to find 1002 the longest match of the signal names within a given subsystem hierarchy level. For example, a set of Madd_Add1_out1_cy elements 1004a-x and 1006x of FIG. 10A has been successfully mapped into element Add1_out1 1022 and 1024 of abstracted critical path of FIG. 10B with an appropriate cumulative latency.

This mapping process may have low fidelity approximation of mapping. In an embodiment, the traversal of the intermediate representation is employed to derive the critical path to be presented to the user. The traversal is described above in connection with FIGS. 6A-C. There may be times when the back-annotation tool 200 is not able to fully match a critical path or when there may be mistakes in the matched critical path, however, overall, the presence of critical path information presented in conjunction with the top-level model may be of use to a user.

Certain embodiments of the present invention are described above. It is, however, expressly noted that the present invention is not limited to these embodiments, but rather the intention is that additions and modifications to what is expressly described herein also are included within the scope of the invention. Moreover, it is to be understood that the features of the various embodiments described herein are not mutually exclusive and can exist in various combinations and permutations, even if such combinations or permutations are not made express herein, without departing from the spirit and scope of the invention.

Since certain changes may be made without departing from the scope of the present invention, it is intended that all matter contained in the above description or shown in the accompanying drawings be interpreted as illustrative and not in a literal sense. Practitioners of the art will realize that the sequence of steps and architectures depicted in the figures may be altered without departing from the scope of the present invention and that the illustrations contained herein are singular examples of a multitude of possible depictions of the present invention.

What is claimed is:

1. A non-transitory computer-readable media storing instructions, the instructions comprising:
 one or more instructions that, when executed by a processor of a computer, cause the processor to:
  generate a hardware description language representation for a target hardware system;
  synthesize the hardware description language representation into a description of the target hardware system;
  determine results of analyzing target characterization data from the description of the target hardware system,
   the target characterization data including information about a path in the target hardware system; and
  map the target characterization data, based on the results of analyzing the target characterization data, to a model for the target hardware system,
   the model comprising a graphical model, and
   the one or more instructions to map the target characterization data include one or more instructions to:
    identify a first element of the model that includes a start of the path;
    map an element from the target characterization data to the first element of the model based on an identifier of the element from the target characterization data,
     the identifier of the element comprising a name of the element;
    perform a first traverse of the path in the model starting from the first element of the model that includes the start of the path; and
    identify the path in the model based on the first traverse.

2. The non-transitory computer-readable media of claim 1, where the description of the target hardware system includes a netlist.

3. The non-transitory computer-readable media of claim 1, where the instructions further comprise:
 one or more instructions that, when executed by the processor, cause the processor to visually superimpose the path on the model.

4. The non-transitory computer-readable media of claim 1, where the one or more instructions to perform the first traverse of the path in the model starting from the first element of the model comprise:
 one or more instructions that, when executed by the processor, cause the processor to:
  traverse a possible path in the model starting from the first element of the model until a fork with multiple possible paths is reached; and
  identify a next element in one of the multiple possible paths.

5. The non-transitory computer-readable media of claim 1, wherein the name of the element is generated by a synthesis tool.

6. The non-transitory computer-readable media of claim 1, where the instructions further comprise:
 one or more instructions that, when executed by the processor, cause the processor to:
  trace the element from the target characterization data to an element in the hardware description language representation; and
  map the element in the hardware description language representation to the first element of the model.

7. The non-transitory computer-readable media of claim 1, where the target characterization data further comprises intellectual property data relating to the target hardware system.

8. The non-transitory computer-readable media of claim 1, where the target characterization data further comprises information about power consumption of the target hardware system.

9. The non-transitory computer-readable media of claim 1, where the target characterization data further comprises information about an area or a cost of the target hardware system.

10. The non-transitory computer-readable media of claim 1, where the one or more instructions to synthesize the hardware description language representation into the description of the target hardware system comprise:
 one or more instructions that, when executed by the processor, cause the processor to:
  execute a synthesis tool on at least a part of the hardware description language representation.

11. The non-transitory computer-readable media of claim 10, where the instructions further comprise:
 one or more instructions that, when executed by the processor, cause the processor to:
  execute a second synthesis tool on the at least a part of hardware description language representation;
  determine different results of analyzing other target characterization data based on executing the second synthesis tool;
  map the other target characterization data, based on the different results, to the model of the target hardware system; and
  provide, for display, the mapped other target characterization data in conjunction with the mapped target characterization data.

12. The non-transitory computer-readable media of claim 1, where the description of the target hardware system is a report generated by a synthesis tool.

13. The non-transitory computer-readable media of claim 1, where the instructions further comprise:
 one or more instructions that, when executed by the processor, cause the processor to:
  perform an additional analysis of the model based on the mapped target characterization data.

14. The non-transitory computer-readable media of claim 13, where the additional analysis is one or more of: a retiming analysis, a resource sharing analysis, or a pipelining analysis.

15. The non-transitory computer-readable media of claim 1,
 where the instructions further comprise:
  one or more instructions that, when executed by the processor, cause the processor to:
   visually overlay at least a portion of the mapped target characterization data on a textual model.

16. The non-transitory computer-readable media of claim 15, where the one or more instructions to visually overlay at least the portion of the mapped target characterization data on the textual model comprise:
 one or more instructions that, when executed by the processor, cause the processor to:
  use at least one or more of: multiple fonts, multiple colors, tooltips, highlighting information, or other visualization tools to overlay at least the portion of the mapped target characterization data.

17. A method comprising:
 generating, by a processor, a hardware description language representation for a target hardware system;
 synthesizing, by the processor, the hardware description language representation into a description of the target hardware system;
 generating, by the processor, information about a path in the target hardware system based on the description of the target hardware system; and
 mapping, by the processor, the information about the path in the target hardware system to a model for the target hardware system,
  the model comprising a graphical model, and
  the mapping of the information about the path including:
   identifying a first element of the model that includes a start of the path;
   mapping an element from the information about the path in the target hardware system to the first element of the model based on an identifier of the element from the information about the path in the target hardware system,
    the identifier of the element comprising a name of the element;
   performing a first traverse of the path in the model starting from the first element of the model that includes the start of the path; and
   identifying the path based on the first traverse.

18. The method of claim 17, where the hardware description language representation includes one or more of: Hardware Description Language (HDL), Verilog, very-high-speed integrated circuits (VHSIC) Hardware Description Language (VHDL), or SystemC.

19. A computer system comprising:
 a memory; and
 a processor, connected to the memory, to:
  generate a hardware description language representation for a target hardware system;
  synthesize the hardware description language representation into a description of the target hardware system;
  generate information about a path in the target hardware system from the description of the target hardware system; and
  map the information about the path to a model,
   the model comprising a graphical model, and
   when mapping the information about the path, the processor is to:
    identify a first element of the model comprising a start of the path;
    map an element from the information about the path in the target hardware system to the first element of the model based on an identifier of the element from the information about the path in the target hardware system,
     the identifier of the element comprising a name of the element;
    perform a first traverse of the path in the model starting from the first element of the model; and
    identify the path based on the first traverse.

20. The computer system of claim 19, where the processor is further to:
 execute the model of the target hardware system; and
 pass results of executing the model of the target hardware system to a synthesis tool.

21. The computer system of claim 19, where the processor is further to:
 annotate the model by indicating a second element of the model that has been removed to optimize the mapped target characterization data.

22. A system comprising:
 a memory to store a model for a target hardware system,
  the model comprising a graphical model; and
 a processor, connected to the memory, to:
  generate a hardware description language representation for the target hardware system;
  transform the hardware description language representation into a description of the target hardware system;
  generate information about a path in the target hardware system based on the description of the target hardware system; and
  map the information about the path in the target hardware system to the model, when mapping the information about the path, the processor is to:
  identify a first element of the model that includes a start of the path;
  map an element from the information about the path to the first element of the model based on an identifier of the element from the information about the path,
    the identifier of the element comprising a name of the element;
  perform a first traverse of the path in the model starting from the first element of the model; and
  identify the path in the model based on the first traverse.

23. The system of claim 22, where the processor is further to:
  receive a revised model for the target hardware system;
  generate different target characterization data for the target hardware system; and
  provide, for display, information based on the different target characterization data for the target hardware system.

24. The system of claim 23, where, when generating the different target characterization data for the target hardware system, the processor is to:
  generate the different target characterization data based at least in part on the mapped information about the path.

25. The system of claim 22,
  where, when mapping the information about the path, the processor is further to:
    identify a second element of the model that includes an end of the path; and
    perform a second traverse of the path in the model starting from the second element of the model while simultaneously performing the first traverse of the path, and where, when identifying the path in the model, the processor is to:
    identify the path in the model based on the first traverse and the second traverse.

26. The system of claim 22, where the processor is further to: provide, for display, the mapped information in conjunction with the model.

* * * * *